US010600802B2

(12) United States Patent
Nakamura et al.

(10) Patent No.: US 10,600,802 B2
(45) Date of Patent: Mar. 24, 2020

(54) MULTI-TIER MEMORY DEVICE WITH ROUNDED TOP PART OF JOINT STRUCTURE AND METHODS OF MAKING THE SAME

(71) Applicant: SANDISK TECHNOLOGIES LLC, Plano, TX (US)

(72) Inventors: Tadashi Nakamura, Yokkaichi (JP); Kota Funayama, Yokkaichi (JP)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 15/914,560

(22) Filed: Mar. 7, 2018

(65) Prior Publication Data

US 2019/0280000 A1 Sep. 12, 2019

(51) Int. Cl.
*H01L 27/11582* (2017.01)
*H01L 29/788* (2006.01)
(Continued)

(52) U.S. Cl.
CPC .... *H01L 27/11582* (2013.01); *H01L 21/0223* (2013.01); *H01L 21/02164* (2013.01);
(Continued)

(58) Field of Classification Search
CPC ......... H01L 27/11582; H01L 27/11556; H01L 21/28282; H01L 29/7883; H01L 29/66833;
(Continued)

(56) References Cited

U.S. PATENT DOCUMENTS 5,915,167 A 6/1999 Leedy
8,884,357 B2 11/2014 Wang et al.
(Continued)

FOREIGN PATENT DOCUMENTS

JP 2010-161305 7/2010

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Jarrett J Stark
(74) *Attorney, Agent, or Firm* — The Marbury Law Group PLLC

(57) ABSTRACT

A first alternating stack of first insulating layers and first spacer layers, an inter-tier dielectric layer, a sacrificial memory opening fill structure, and a second alternating stack of second insulating layers and second spacer layers are formed over a substrate. The spacer layers are formed as, or are subsequently replaced with, electrically conductive layers. A concave downward-facing surface of the inter-tier dielectric layer is formed on a convex upper surface of the sacrificial memory opening fill structure. An inter-tier memory opening is provided by forming second-tier memory opening and removing the sacrificial memory opening fill structure. A memory stack structure including a memory film is formed in the inter-tier memory opening. The memory film includes a rounded top surface at the joint between tiers to enhance its reliability.

15 Claims, 39 Drawing Sheets

50 60 52 54 56 602 601 63 58 or 20 270 62 246 44 232 170 146 132 11 10

50 60 52 54 56 602 601 63 58 or 20 270 62 246 44 232 170 170C 50C 58V 170D 50D 146 132 11 10

(51) Int. Cl.

| | |
|---|---|
| ***H01L 29/10*** | (2006.01) |
| ***H01L 21/311*** | (2006.01) |
| ***H01L 29/66*** | (2006.01) |
| ***H01L 21/3105*** | (2006.01) |
| ***H01L 21/02*** | (2006.01) |
| ***H01L 27/11556*** | (2017.01) |
| ***H01L 21/28*** | (2006.01) |
| *H01L 27/11519* | (2017.01) |
| *H01L 27/11526* | (2017.01) |
| *H01L 27/11521* | (2017.01) |
| *H01L 27/11565* | (2017.01) |
| *H01L 27/11568* | (2017.01) |
| *H01L 27/11573* | (2017.01) |
| *H01L 29/792* | (2006.01) |
| *H01L 27/11529* | (2017.01) |
| *H01L 27/11524* | (2017.01) |
| *H01L 27/1157* | (2017.01) |

(52) U.S. Cl.

CPC .. *H01L 21/02636* (2013.01); *H01L 21/31051* (2013.01); *H01L 21/31111* (2013.01); *H01L 27/11556* (2013.01); *H01L 29/1037* (2013.01); *H01L 29/40114* (2019.08); *H01L 29/40117* (2019.08); *H01L 29/6653* (2013.01); *H01L 29/7883* (2013.01); *H01L 21/0217* (2013.01); *H01L 21/02211* (2013.01); *H01L 21/02271* (2013.01); *H01L 27/1157* (2013.01); *H01L 27/11519* (2013.01); *H01L 27/11521* (2013.01); *H01L 27/11524* (2013.01); *H01L 27/11526* (2013.01); *H01L 27/11529* (2013.01); *H01L 27/11565* (2013.01); *H01L 27/11568* (2013.01); *H01L 27/11573* (2013.01); *H01L 29/66825* (2013.01); *H01L 29/66833* (2013.01); *H01L 29/7889* (2013.01); *H01L 29/7926* (2013.01)

(58) Field of Classification Search

CPC ........... H01L 29/66825; H01L 29/7926; H01L 29/7889; H01L 27/11568; H01L 27/11524; H01L 27/11529; H01L 27/1157; H01L 27/11517–1156; H01L 2924/1438; H01L 29/42324–42336; H01L 29/788–7889; H01L 27/11563–11582; H01L 2924/14511; H01L 29/4234–42352; H01L 29/518; H01L 29/792–7926; G11C 11/5621–5642; G11C 16/0408–0458; G11C 16/0483; G11C 27/005; G11C 16/0466–0475; G11C 11/5671

See application file for complete search history.

(56) References Cited

U.S. PATENT DOCUMENTS

| | | | | |
|---|---|---|---|---|
| 8,946,023 | B2 | 2/2015 | Makala et al. | |
| 9,224,752 | B1 | 12/2015 | Lee et al. | |
| 9,230,987 | B2 | 1/2016 | Pachamuthu et al. | |
| 9,343,358 | B1 | 5/2016 | Xu | |
| 9,502,471 | B1 | 11/2016 | Lu et al. | |
| 9,570,463 | B1 | 2/2017 | Zhang et al. | |
| 9,627,403 | B2 | 4/2017 | Liu et al. | |
| 9,728,551 | B1 | 8/2017 | Lu et al. | |
| 9,768,192 | B1 | 9/2017 | Nakamura | |
| 9,780,034 | B1 * | 10/2017 | Tsutsumi | H01L 27/11565 |
| 9,871,052 | B2 * | 1/2018 | Lee | H01L 27/11582 |
| 9,991,280 | B2 * | 6/2018 | Nakamura | H01L 27/11582 |
| 2004/0042323 | A1 | 3/2004 | Moshayedi | |
| 2007/0259570 | A1 | 11/2007 | Moshayedi | |
| 2007/0296021 | A1 | 12/2007 | Sugiyama et al. | |
| 2011/0287612 | A1 | 11/2011 | Lee et al. | |
| 2012/0001247 | A1 | 1/2012 | Alsmeier | |
| 2012/0001252 | A1 * | 1/2012 | Alsmeier | H01L 27/11551 257/321 |
| 2012/0003800 | A1 * | 1/2012 | Lee | H01L 27/11551 438/261 |
| 2012/0198591 | A1 | 8/2012 | Ohnesorge | |
| 2013/0010558 | A1 | 1/2013 | Chang et al. | |
| 2013/0130468 | A1 * | 5/2013 | Higashitani | H01L 29/7926 438/382 |
| 2014/0252454 | A1 * | 9/2014 | Rabkin | H01L 27/249 257/329 |
| 2014/0273373 | A1 * | 9/2014 | Makala | H01L 27/11582 438/270 |
| 2015/0016242 | A1 | 1/2015 | Ernstrom et al. | |
| 2015/0155296 | A1 * | 6/2015 | Yoon | H01L 27/11582 257/324 |
| 2015/0294978 | A1 | 10/2015 | Lu et al. | |
| 2017/0062454 | A1 | 3/2017 | Lu et al. | |
| 2017/0229472 | A1 | 8/2017 | Lu et al. | |
| 2017/0236835 | A1 | 8/2017 | Nakamura et al. | |
| 2017/0243879 | A1 | 8/2017 | Yu et al. | |
| 2017/0271261 | A1 | 9/2017 | Tsutsumi et al. | |
| 2017/0271352 | A1 | 9/2017 | Nakamura | |
| 2017/0358593 | A1 * | 12/2017 | Yu | H01L 23/5226 |
| 2018/0006049 | A1 | 1/2018 | Inomata et al. | |

OTHER PUBLICATIONS

Hammond, M. L., "Silicon Epitaxy by Chemical Vapor Deposition," pp. 45-106.

Csepregi, L. et al., "Substrate-Orientation Dependence of the Epitaxial Regrowth Rate from Si-Implanted Amorphous Si," Journal of Applied Physics, vol. 49, No. 7, pp. 3906-3911 (1978).

Seidel, H. et al., "Anisotropic Etching of Crystalline Silicon in Alkaline Solutions," J. Electrochem. Soc., vol. 137, No. 11, pp. 3612-3626, (1990).

Non-Final Office Communication for U.S. Appl. No. 15/071,575, dated Nov. 16, 2016, 13 pages.

Invitation to Pay Additional Fees from the International Searching Authority for International Patent Application No. PCT/US2017/017823, dated May 4, 2017, 18 pages.

International Application No. PCT/US2017/017823, International Search Report and Written Opinion, dated Jul. 5, 2017, 24pgs.

U.S. Appl. No. 15/445,579, filed Feb. 28, 2017, Sandisk Technologies LLC.

U.S. Appl. No. 15/593,820, filed May 12, 2017, Sandisk Technologies LLC.

U.S. Appl. No. 15/632,983, filed Jun. 26, 2017, Sandisk Technologies LLC.

* cited by examiner 601
50
52 54 56
170C
50C
49'
270
242
232
170
142
132
10
11

601
52 54 56
170C
49'

MULTI-TIER MEMORY DEVICE WITH ROUNDED TOP PART OF JOINT STRUCTURE AND METHODS OF MAKING THE SAME

FIELD

The present disclosure relates generally to the field of semiconductor devices and specifically to a three-dimensional multi-tier memory device containing rounded top part of joint structures and methods of making the same.

BACKGROUND

Recently, ultra high density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a three-dimensional memory device is provided, which comprises: a first alternating stack of first insulating layers and first electrically conductive layers located over a substrate; an inter-tier dielectric layer located over the first alternating stack; a second alternating stack of second insulating layers and second electrically conductive layers located over the inter-tier dielectric layer; a memory stack structure vertically extending through the second alternating stack, the inter-tier dielectric layer, and the first alternating stack. The memory stack structure comprises a semiconductor channel and a memory film laterally surrounding the semiconductor channel. The memory film comprises an upper portion embedded in the second alternating stack, a lower portion embedded in the first alternating stack, and an inter-tier level portion embedded in the inter-tier dielectric layer that laterally protrudes outward relative to outer sidewalls of the upper portion and the lower portion. The inter-tier level portion of the memory film has a convex upper surface that contacts a concave downward-facing surface of the inter-tier dielectric layer.

According to another aspect of the present disclosure, a method of forming a three-dimensional memory device is provided, which comprises the steps of: forming a first alternating stack of first insulating layers and first spacer layers over a substrate, wherein the first spacer layers are formed as, or are subsequently replaced with, first electrically conductive layers; forming a combination of an inter-tier dielectric layer and a sacrificial memory opening fill structure extending through the first alternating stack and the inter-tier dielectric layer, wherein a concave downward-facing surface of the inter-tier dielectric layer is formed on a convex upper surface of the sacrificial memory opening fill structure; forming a second alternating stack of second insulating layers and second spacer layers over the inter-tier dielectric layer, wherein the second spacer layers are formed as, or are subsequently replaced with, second electrically conductive layers; forming an inter-tier memory opening by forming a second-tier memory opening through the second alternating stack and removing the sacrificial memory opening fill structure from underneath the second-tier memory opening; and forming a memory stack structure in the inter-tier memory opening, wherein the memory stack structure comprises a memory film and a semiconductor channel, and the memory film comprises an upper portion embedded in the second alternating stack, a lower portion embedded in the first alternating stack, and an inter-tier level portion embedded in the inter-tier dielectric layer and having a convex upper surface that contacts the concave downward-facing surface of the inter-tier dielectric layer.

8A. The zig-zag vertical plane A-A' corresponds to the plane of the vertical cross-sectional view of FIG. 8A.

Figure 9:
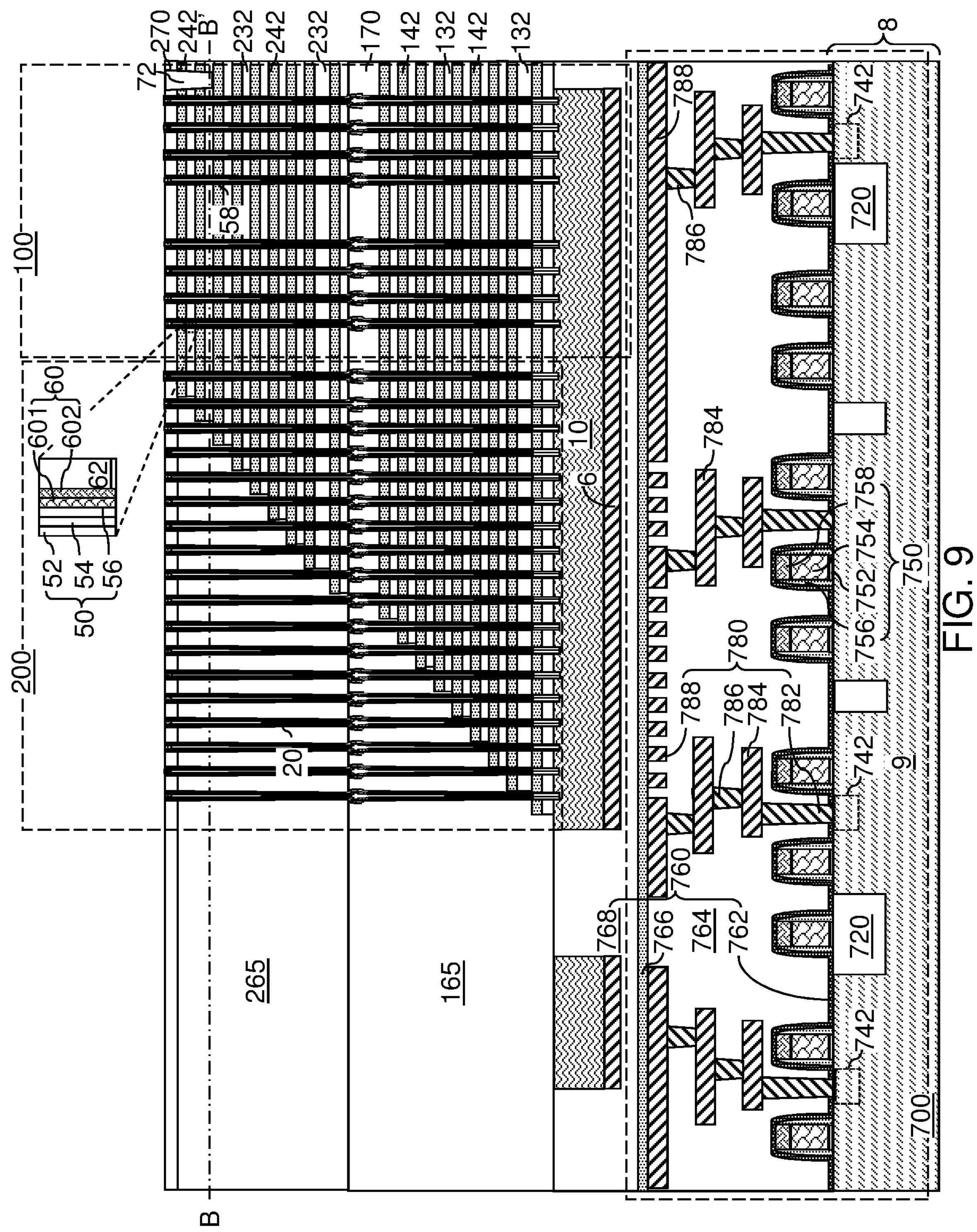

FIG. 9 is a vertical cross-sectional view of the first exemplary structure after formation of inter-tier openings, memory stack structures, and support pillar structures according to the first embodiment of the present disclosure.

FIGS. 10A-10H are sequential vertical cross-sectional views of an inter-tier memory opening during formation of a pillar channel portion, a memory stack structure, a dielectric core, and a drain region according to the first embodiment of the present disclosure.

Figure 11A:
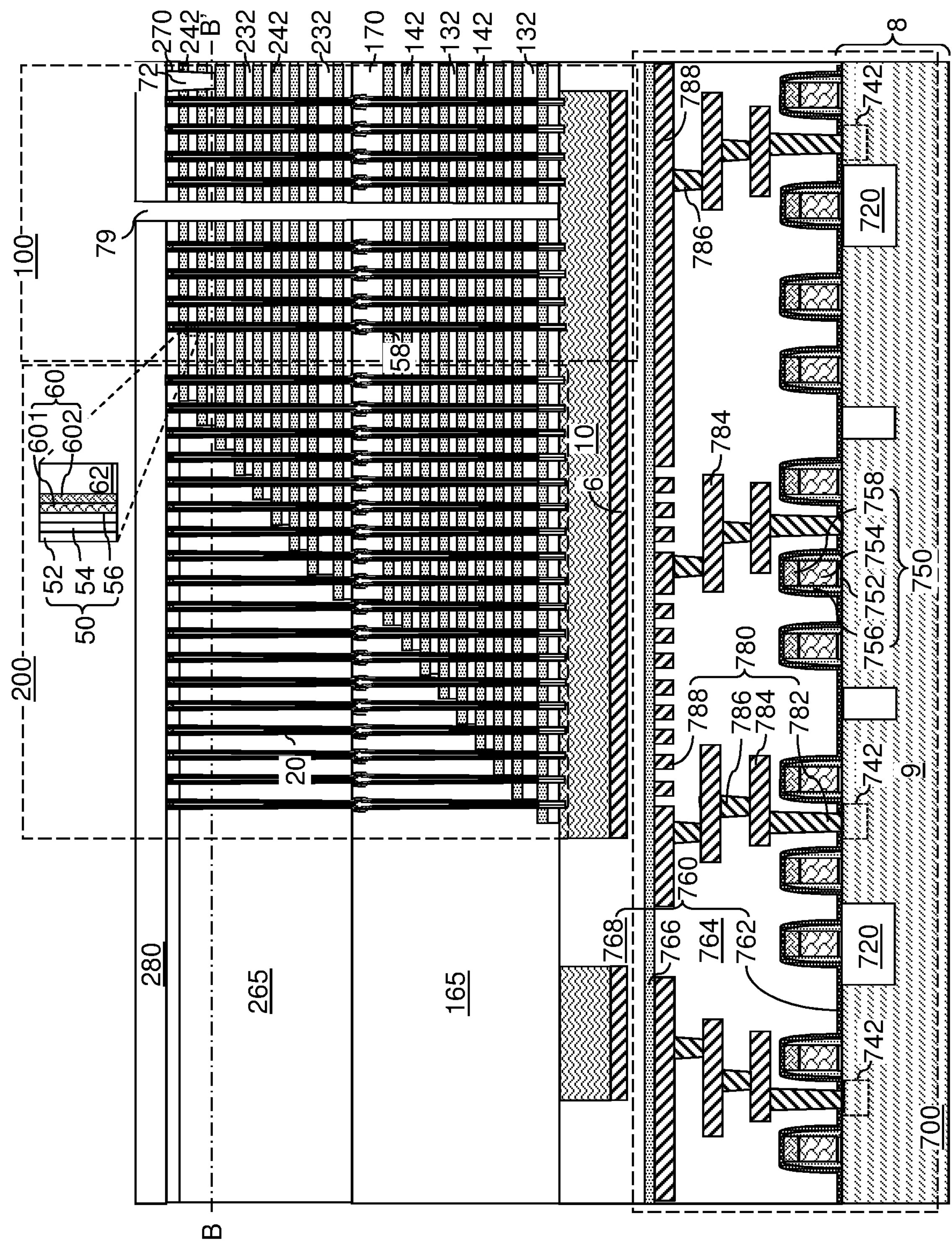

FIG. 11A is a vertical cross-sectional view of the first exemplary structure after formation of backside contact trenches according to the first embodiment of the present disclosure.

Figure 11B:
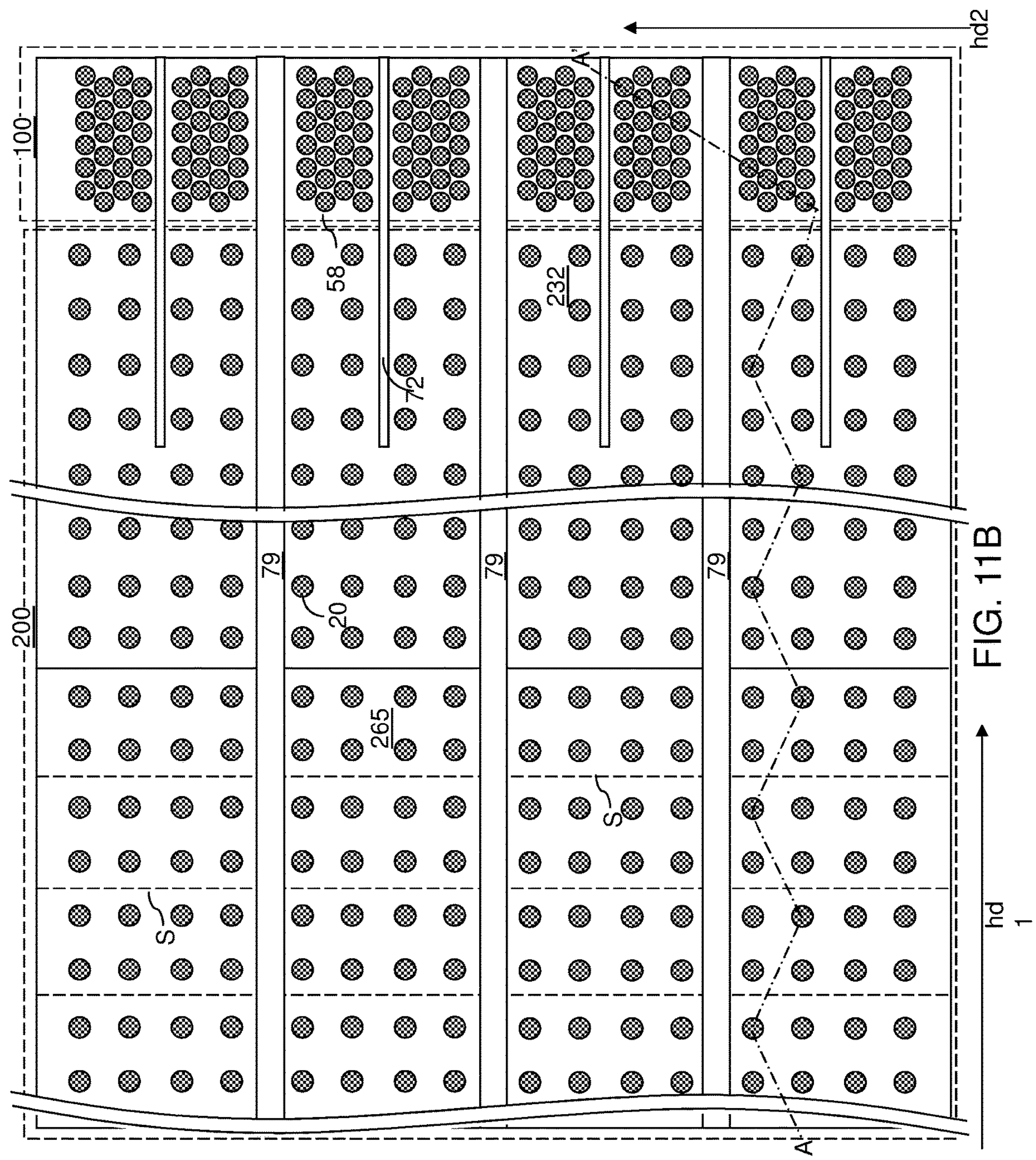

FIG. 11B is a horizontal cross-sectional view of the first exemplary structure along the horizontal plane B-B' in FIG. 11A. The zig-zag vertical plane A-A' corresponds to the plane of the vertical cross-sectional view of FIG. 11A.

Figure 12A:
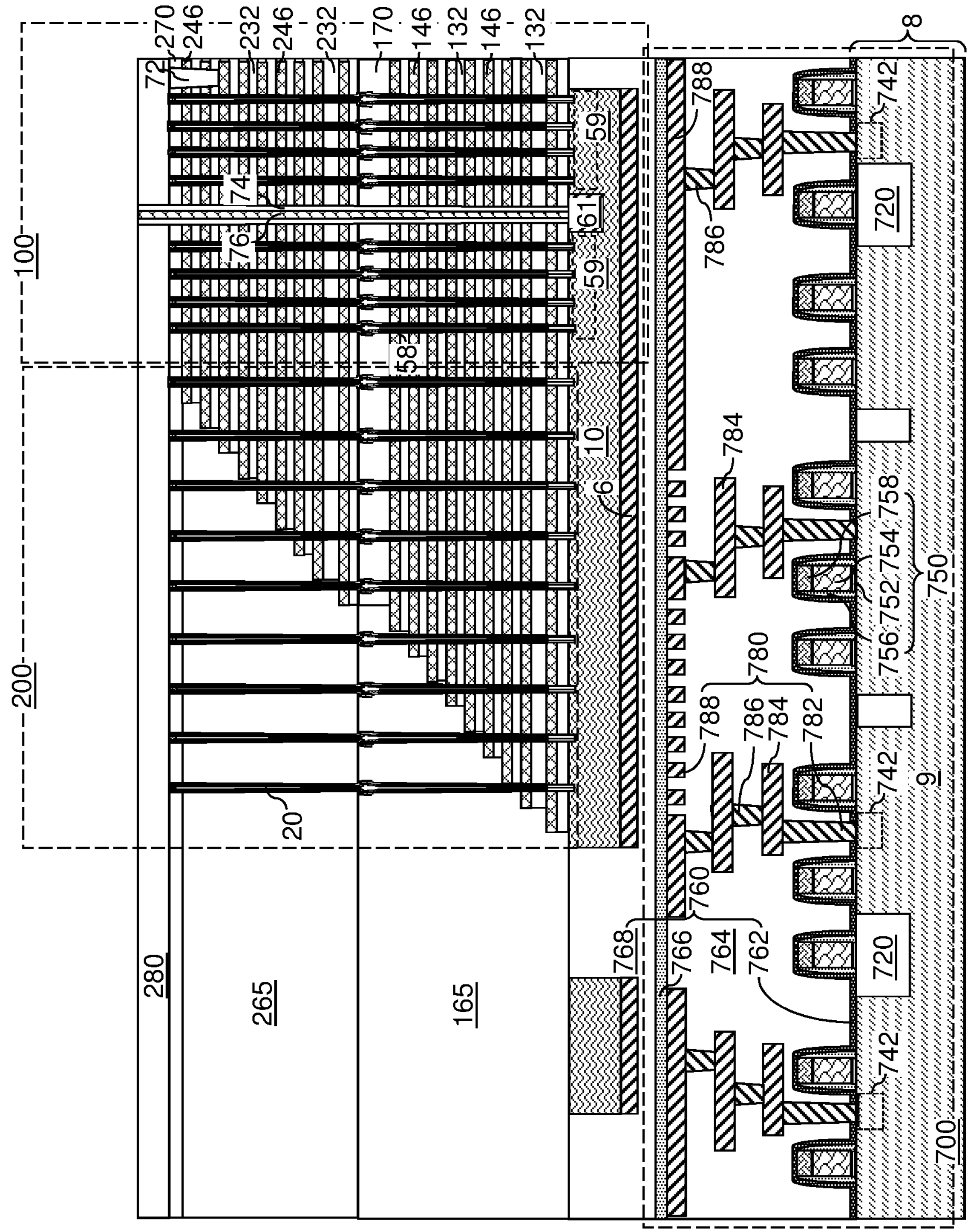

FIG. 12A is a vertical cross-sectional view of the first exemplary structure after replacement of sacrificial material layers with electrically conductive layers and formation of insulating spacers and backside contact via structures according to the first embodiment of the present disclosure.

Figure 12B:
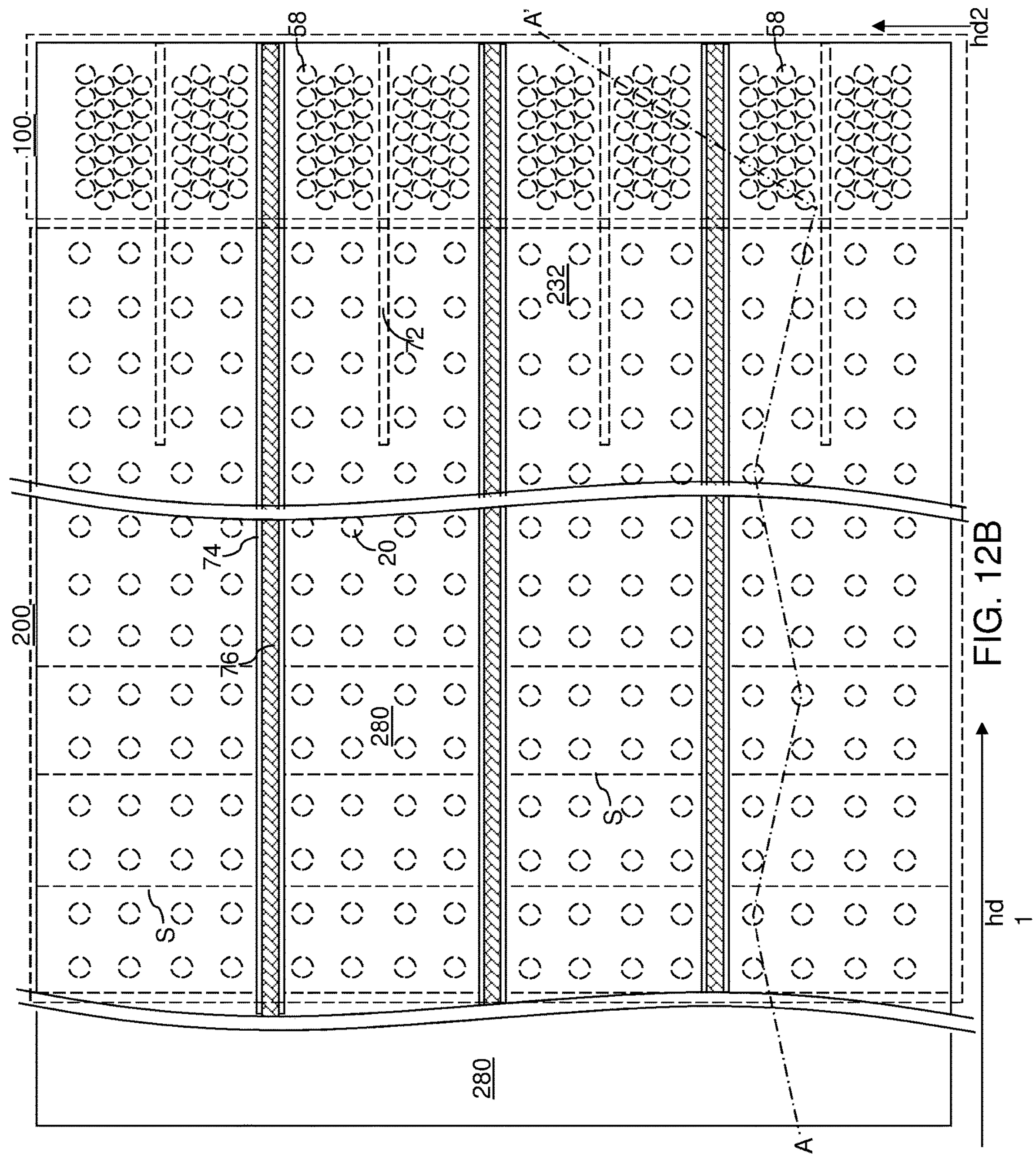

FIG. 12B is a top view of the first exemplary structure along the horizontal plane B-B' of FIG. 12A. The zig-zag vertical plane A-A' corresponds to the plane of the vertical cross-sectional view of FIG. 12A.

Figure 12C:
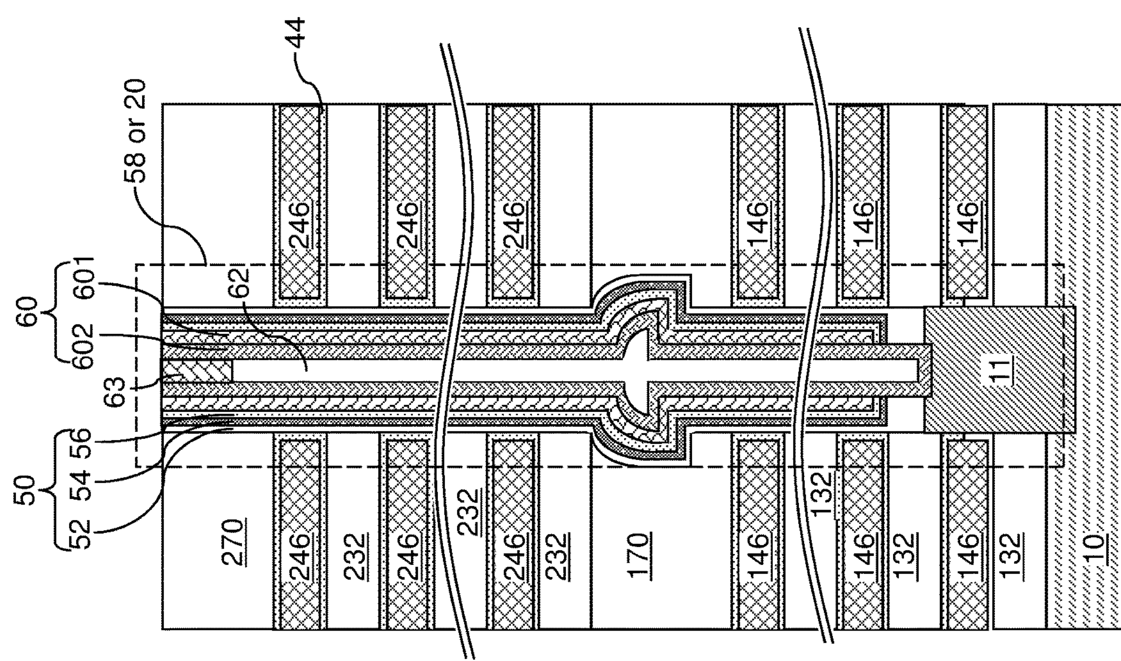

FIG. 12C is a vertical cross-sectional view of a region around a memory stack structure at the processing step of FIGS. 12A and 12B.

Figure 13A:
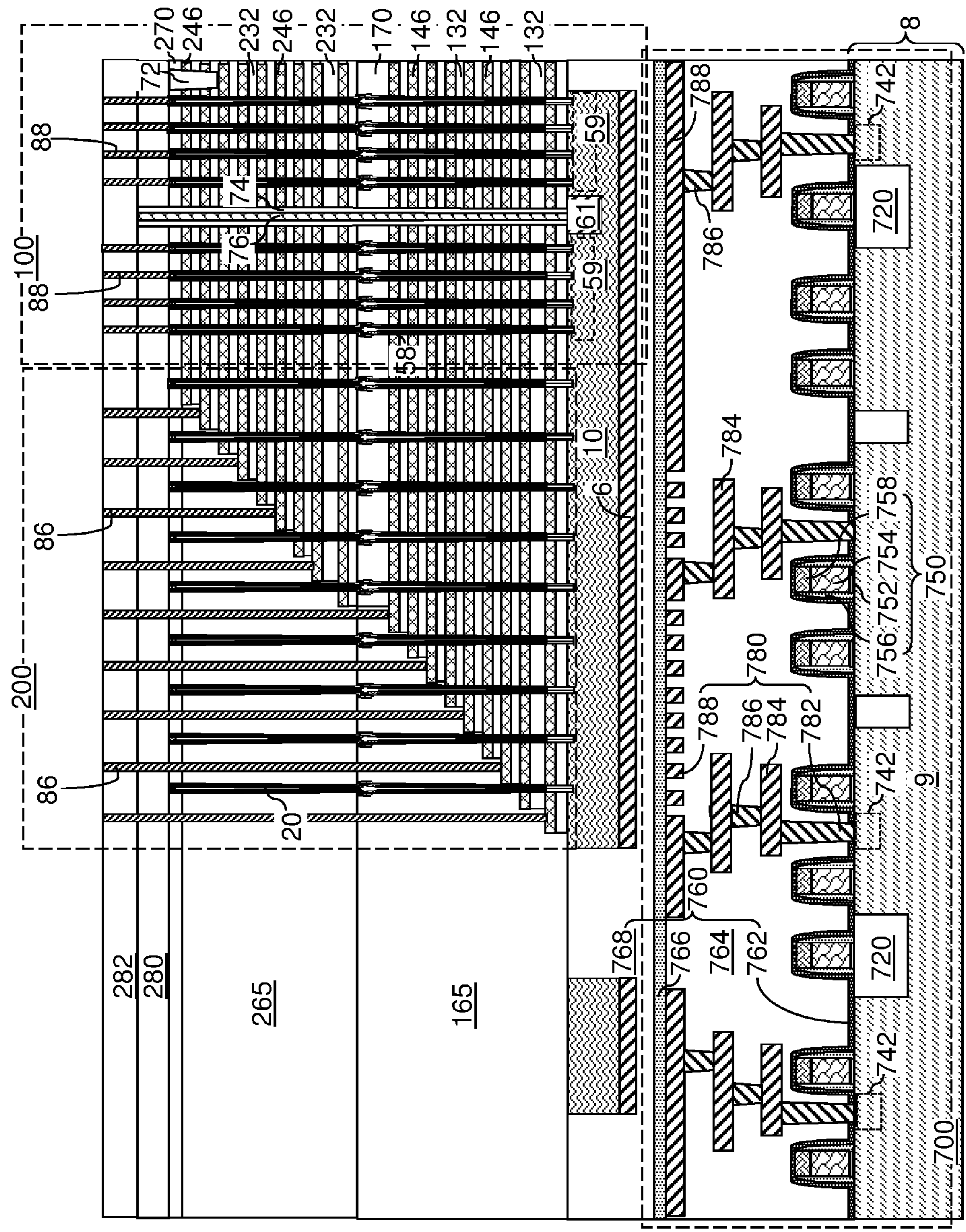

FIG. 13A is a vertical cross-sectional view of the first exemplary structure after formation of drain contact via structures and word line contact via structures according to the first embodiment of the present disclosure.

Figure 13B:
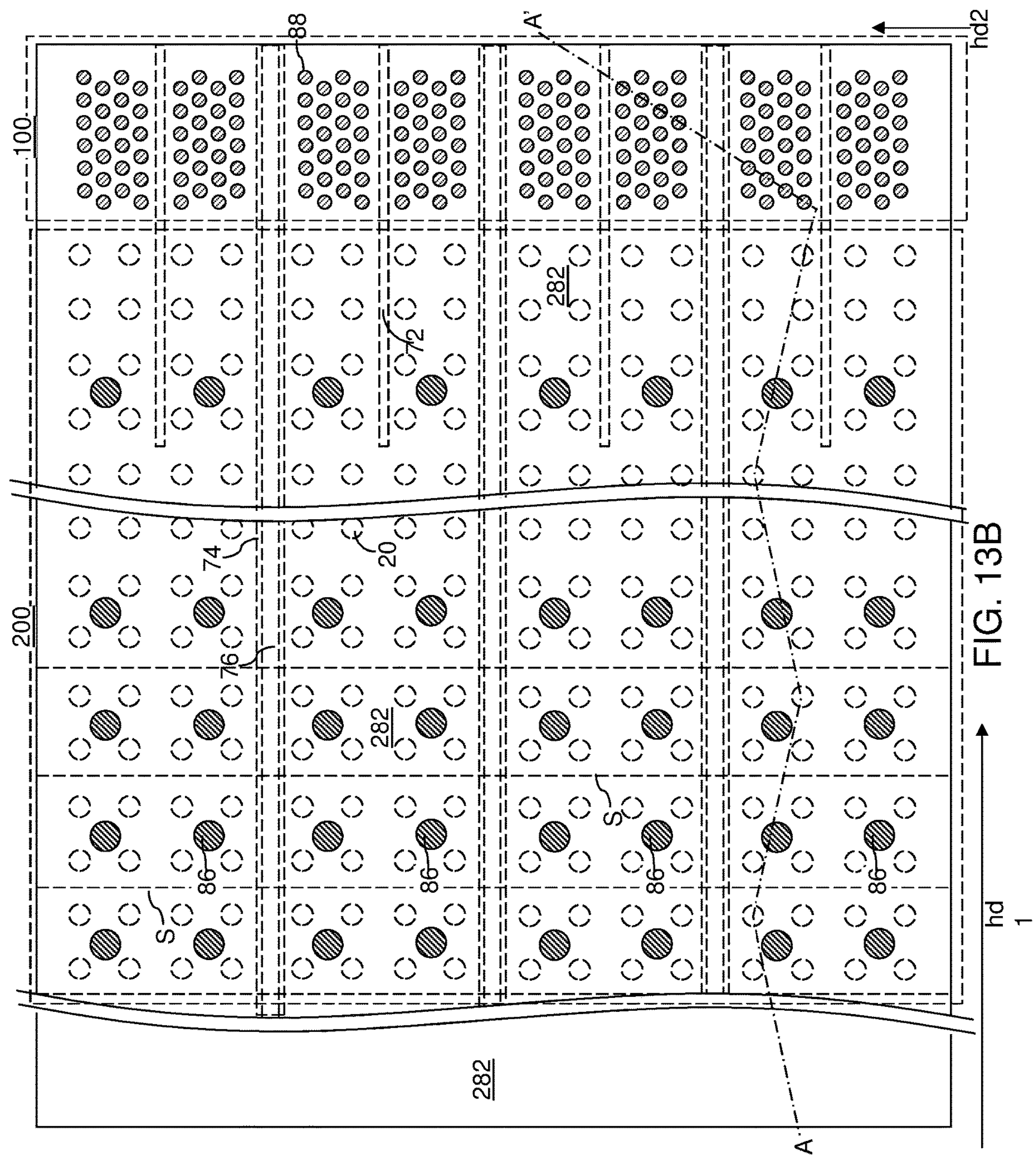

FIG. 13B is a top view of the first exemplary structure along the horizontal plane B-B' of FIG. 13A. The zig-zag vertical plane A-A' corresponds to the plane of the vertical cross-sectional view of FIG. 13A.

Figure 14A:
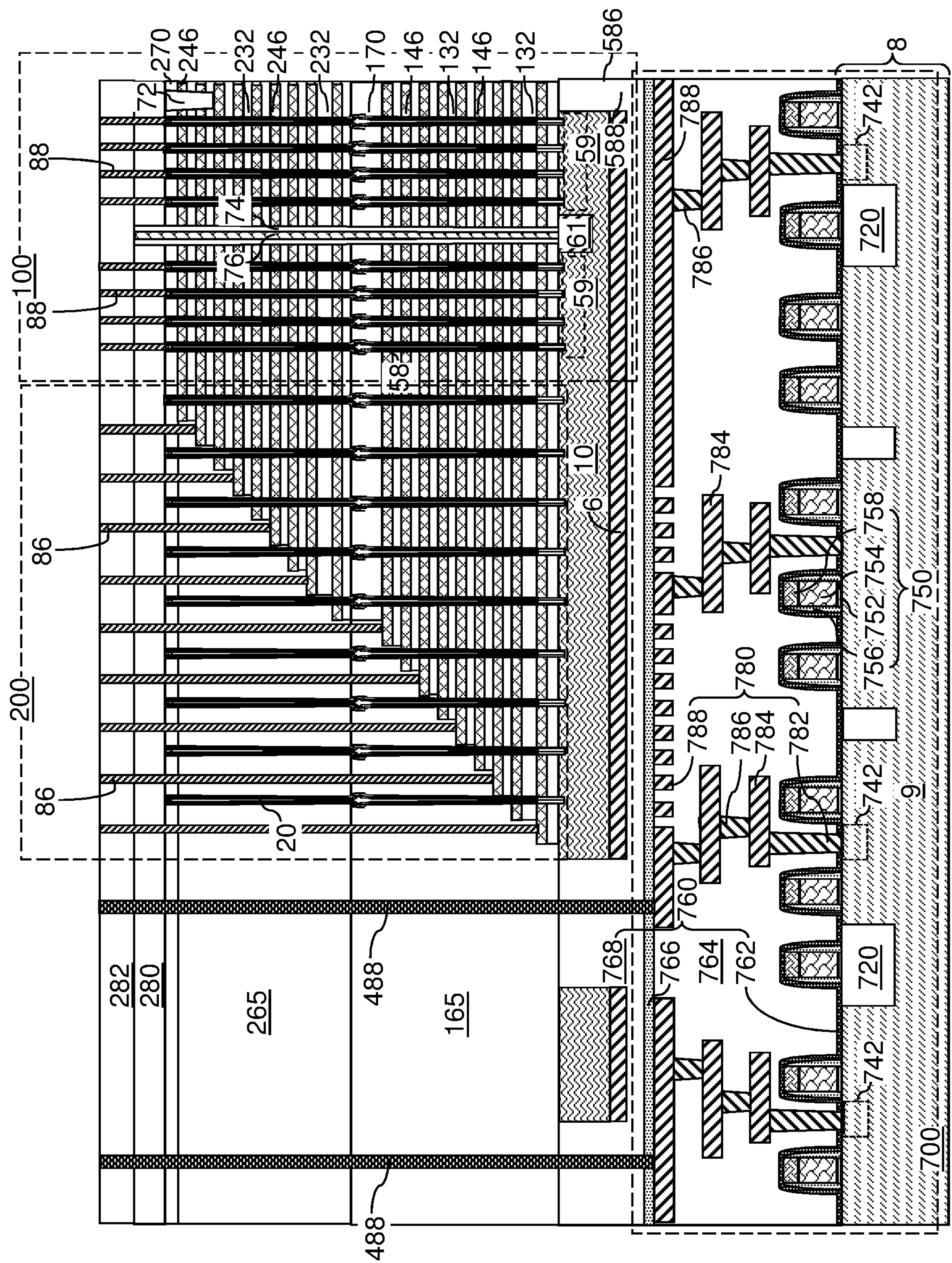

FIG. 14A is a vertical cross-sectional view of the first exemplary structure after formation of through-stack contact via structures and through-dielectric contact via structures according to the first embodiment of the present disclosure.

Figure 14B:
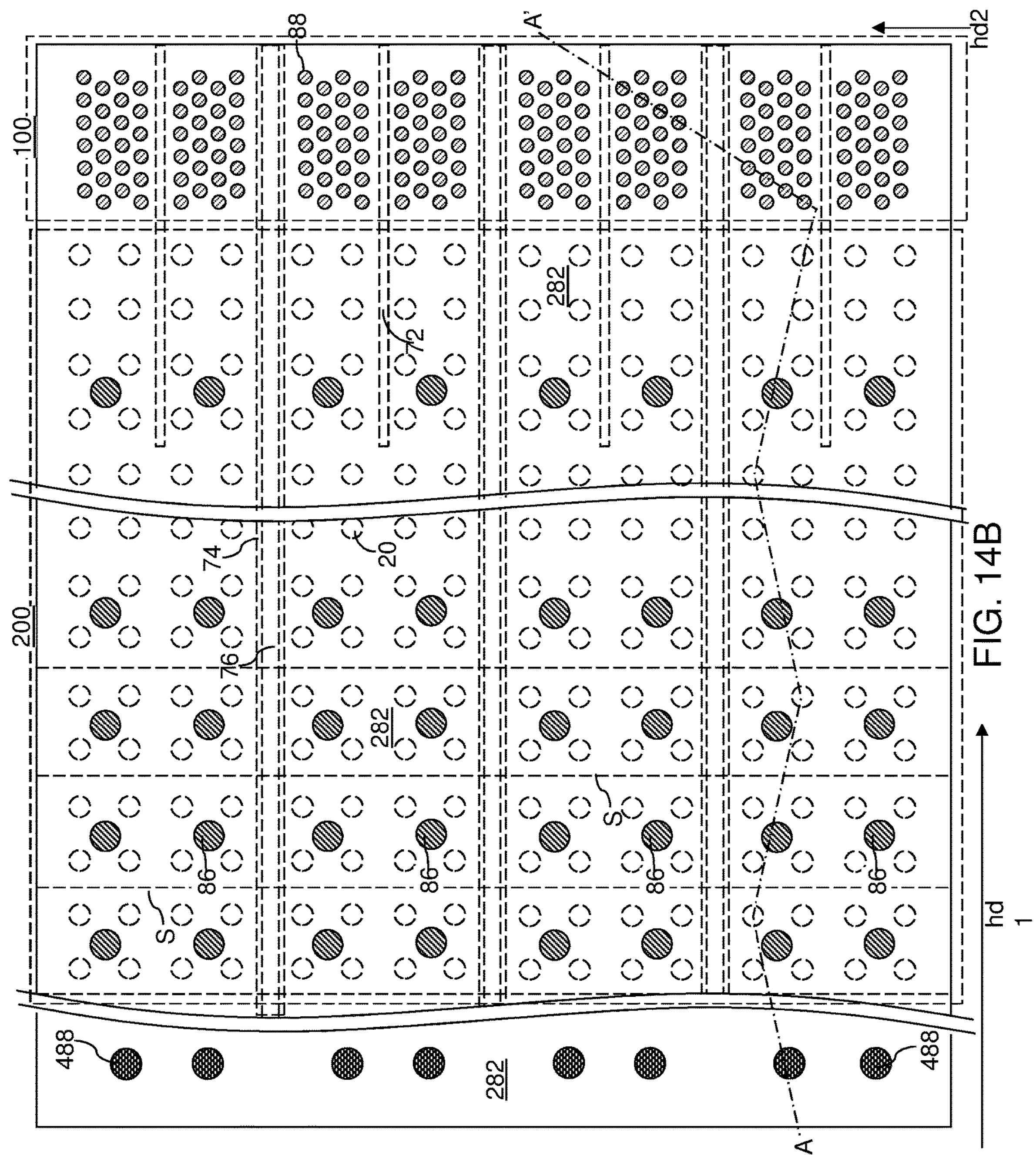

FIG. 14B is a top view of the first exemplary structure along the horizontal plane B-B' of FIG. 14A. The zig-zag vertical plane A-A' corresponds to the plane of the vertical cross-sectional view of FIG. 14A.

Figure 15:
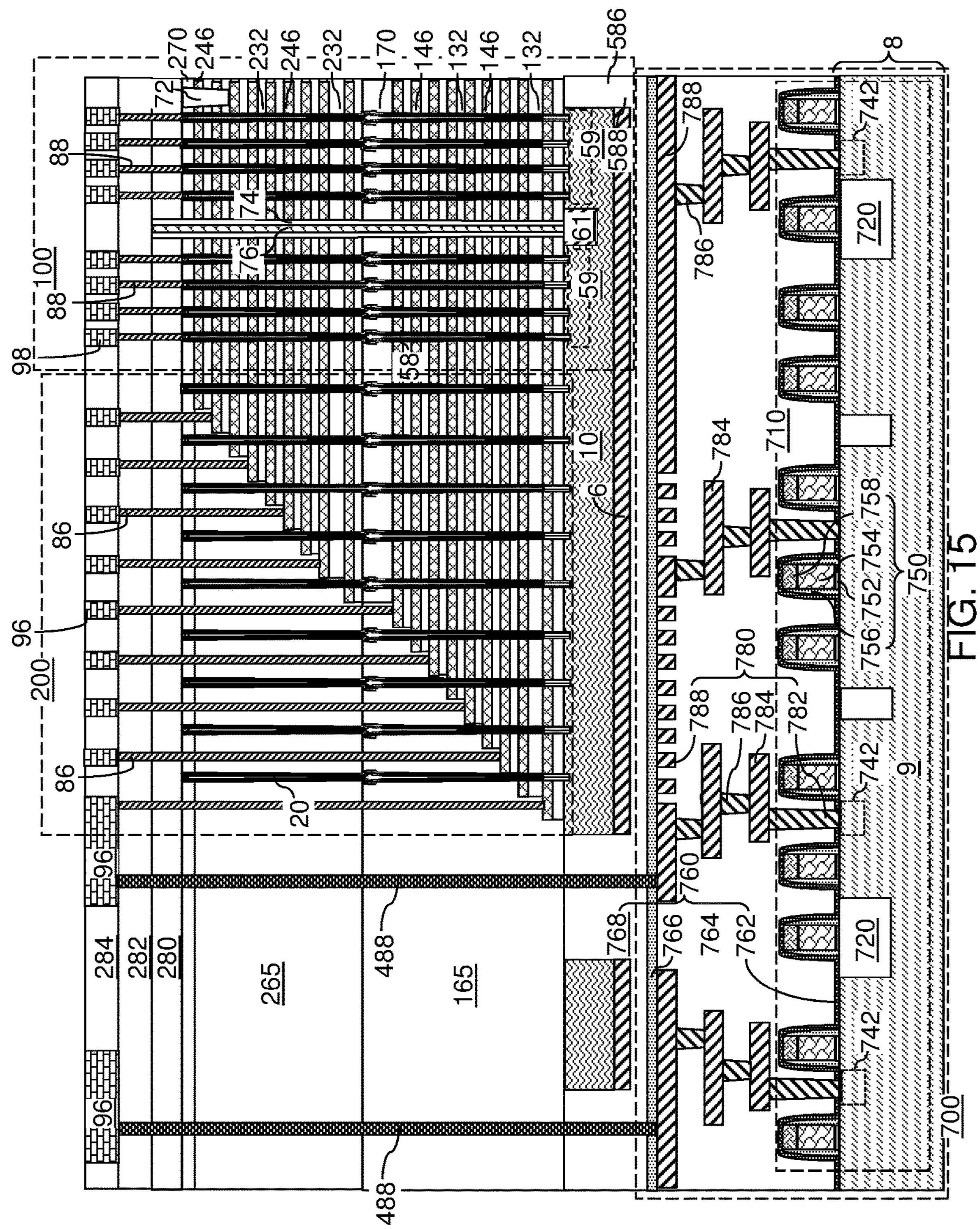

FIG. 15 is a vertical cross-sectional view of the first exemplary structure after formation of upper metal line structures according to the first embodiment of the present disclosure.

FIGS. 16A-16G are sequential vertical cross-sectional views of a region of a second exemplary structure during formation of an inter-tier dielectric layer and sacrificial memory opening fill structures according to a second embodiment of the present disclosure.

Figures 17A, 17B:
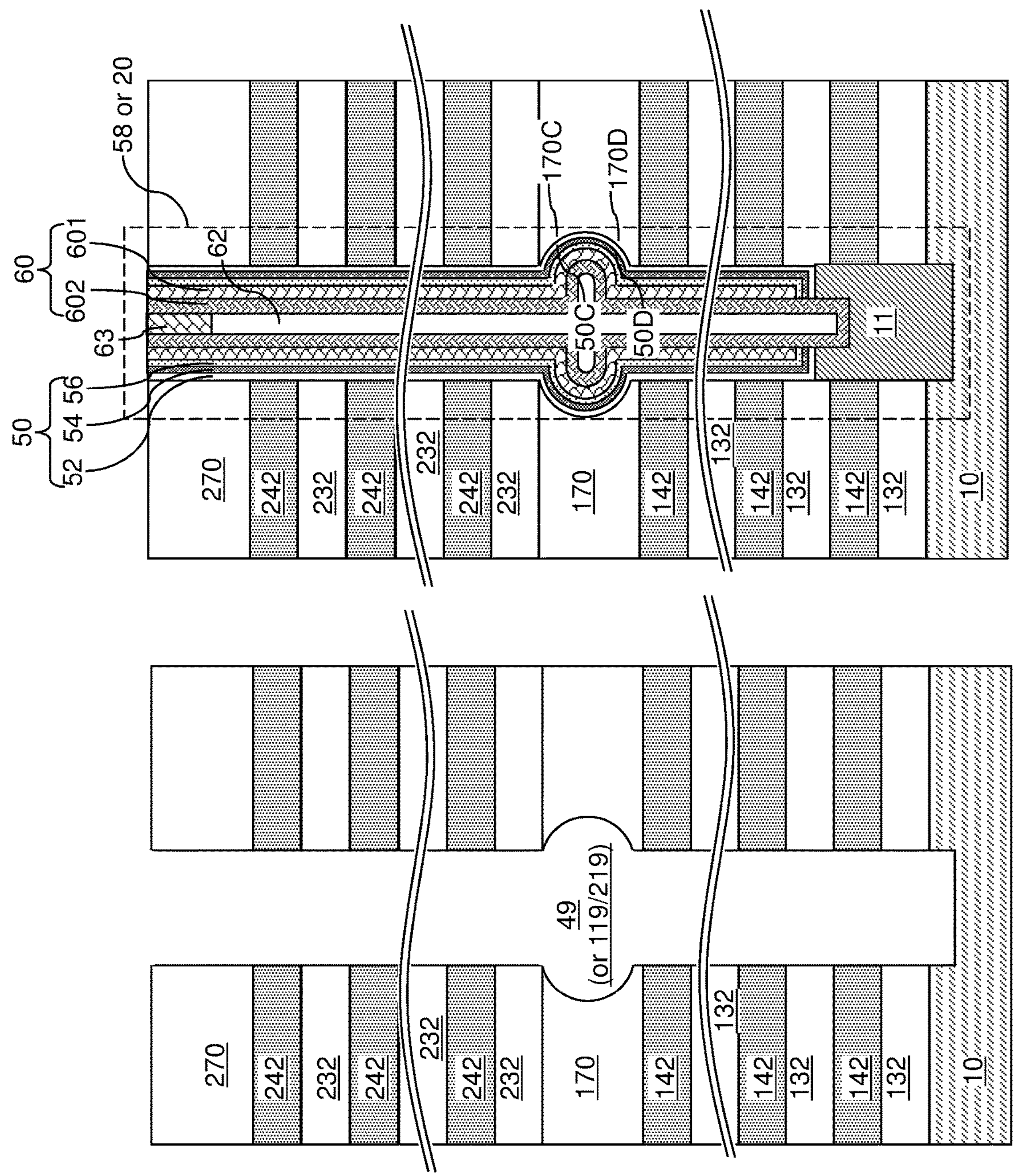

FIG. 17A is a vertical cross-section view of a region of the second exemplary structure after formation of an inter-tier memory opening according to the second embodiment of the present disclosure.

FIG. 17B is a vertical cross-sectional view of a region of the second exemplary structure after formation of a pillar channel portion, a memory stack structure, a dielectric core, and a drain region according to the second embodiment of the present disclosure.

Figure 18:
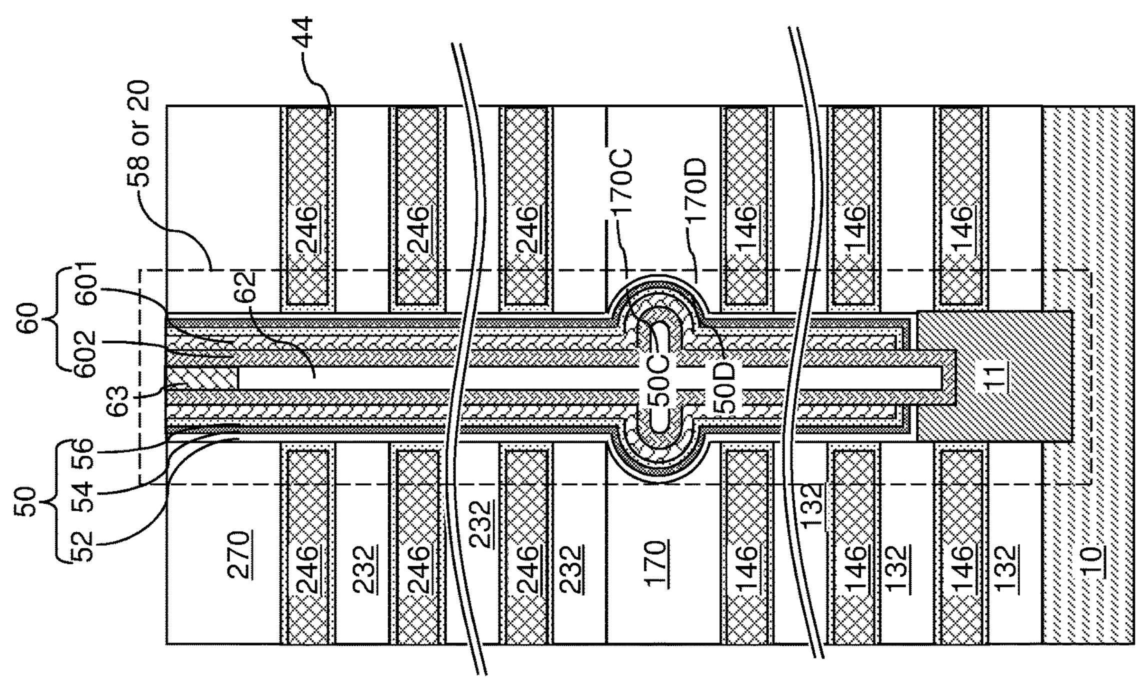

FIG. 18 is a vertical cross-sectional view of a region of the second exemplary structure after replacement of sacrificial material layers with electrically conductive layers according to the second embodiment of the present disclosure.

Figure 19:
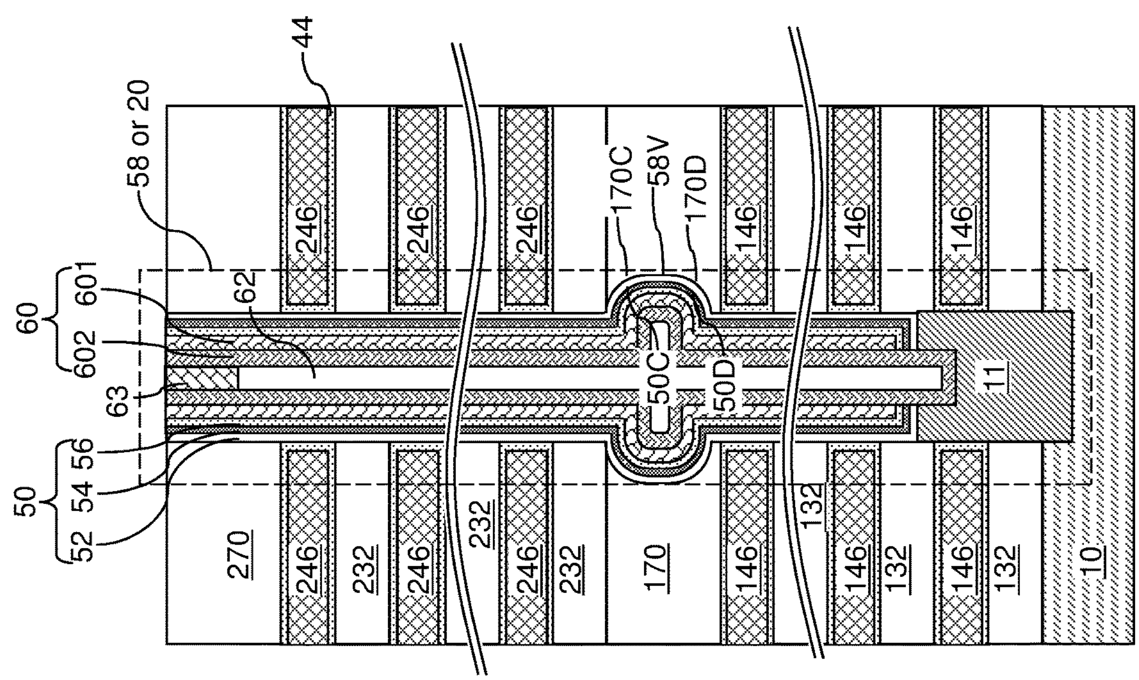

FIG. 19 is a vertical cross-sectional view of a region of an alternative embodiment of the second exemplary structure after replacement of sacrificial material layers with electrically conductive layers according to the second embodiment of the present disclosure.

DETAILED DESCRIPTION

A memory stack structure in a three-dimensional memory device (e.g., a three-dimensional NAND memory device) includes a blocking dielectric layer and a tunneling dielectric layer. Structural integrity and uniformity of each dielectric layer is desired to provide reliable performance of memory cells in the memory stack structures. Forming such dielectric layers in three-dimensional memory devices having multi-tier stack structures is difficult because dielectric layers tend to be formed with sharp corners and/or variable thicknesses in joint regions between the stacks. For example, a portion of a thinner blocking dielectric layer formed in a laterally recessed corner of a joint region can have a lesser thickness, and can be susceptible to dielectric breakdown and/or current leakage during operation.

The embodiments of the present disclosure are directed to a three-dimensional memory device containing rounded top part of joint structures between the tiers of the memory device, and methods of making the same, the various aspect of which are described herein in detail. The rounded top part of the joint structures is less susceptible to dielectric breakdown and/or current leakage through the dielectric layers located at the top part of the joint structures. The embodiments of the present disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as “first,” “second,” and “third” are employed merely to identify similar elements, and different ordinals may be employed across the specification and the claims of the instant disclosure. Unless otherwise indicated, a “contact” between elements refers to a direct contact between elements that provides an edge or a surface shared by the elements. Unless otherwise indicated, elements having the same reference numerals are presumed to have the same composition. As used herein, a first element located “on” a second element can be located on the exterior side of a surface of the second element or on the interior side of the second element. As used herein, a first element is located “directly on” a second element if there exist a physical contact between a surface of the first element and a surface of the second element. As used herein, an “in-process” structure or a “transient” structure refers to a structure that is subsequently modified.

As used herein, a “layer” refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1:
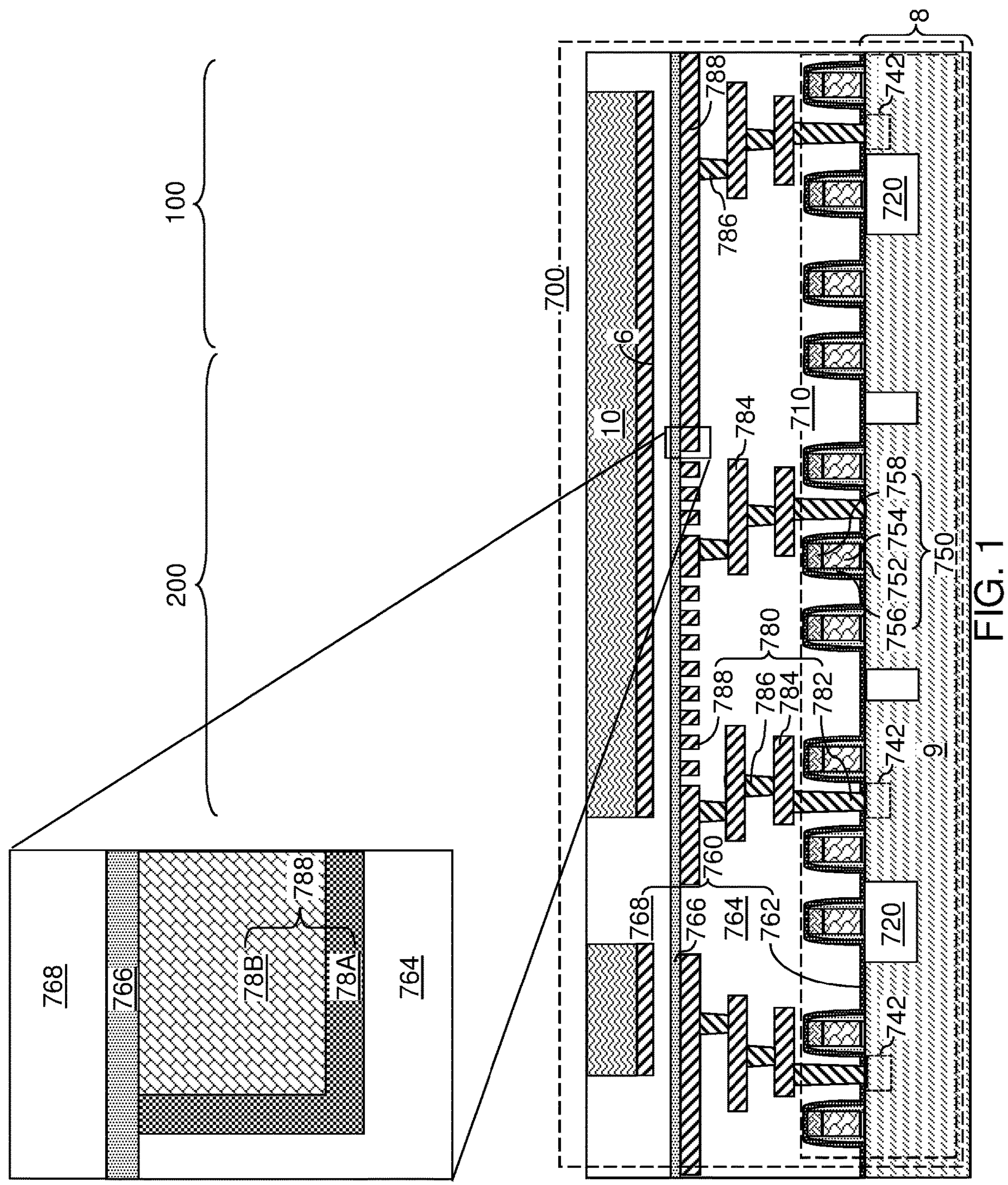
FIG. 1 is a vertical cross-sectional view of a first exemplary structure after formation of semiconductor devices, lower level dielectric layers including a silicon nitride layer, lower metal interconnect structures, and a planar semiconductor material layer on a semiconductor substrate according to a first embodiment of the present disclosure.

Referring to FIG. 1, a first exemplary structure according to a first embodiment of the present disclosure is illustrated. The first exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride layer (e.g., hydrogen diffusion barrier) 766 that overlies the dielectric material layer 764, and at least one second dielectric layer 768.

The dielectric layer stack including the lower level dielectric layers 760 functions as a matrix for lower metal interconnect structures 780 that provide electrical wiring among the various nodes of the semiconductor devices and landing pads for through-stack contact via structures to be subsequently formed. The lower metal interconnect structures 780 are embedded within the dielectric layer stack of the lower level dielectric layers 760, and comprise a lower metal line structure located under and optionally contacting a bottom surface of the silicon nitride layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride layer 766. In one embodiment, the silicon nitride layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride layer 766 is selected such that the silicon nitride layer 766 functions as a sufficiently robust hydrogen diffusion barrier for subsequent thermal processes. For example, the thickness of the silicon nitride layer 766 can be in a range from 6 nm to 100 nm, although lesser and greater thicknesses may also be employed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-stack contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a word line contact region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 1 for clarity. Through-stack contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-stack contact via structures to be subsequently formed.

Figure 2:
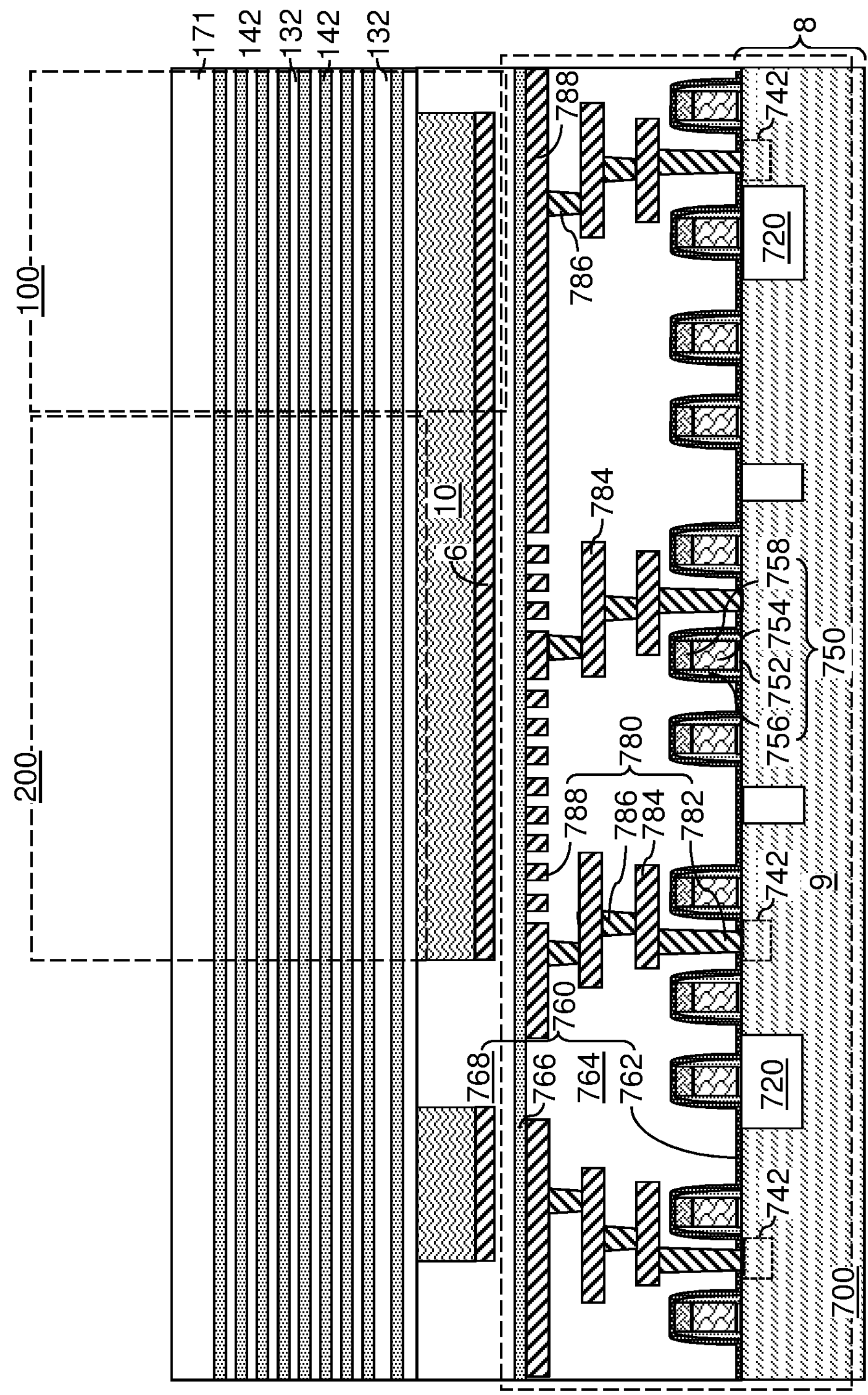
FIG. 2 is a vertical cross-sectional view of the first exemplary structure after formation of a first alternating stack of first insulting layers and first spacer material layers according to the first embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

A first inter-tier dielectric component layer 171 is subsequently formed over the stack (132, 142). The first inter-tier dielectric component layer 171 includes a dielectric material, which is herein referred to as a first component dielectric material. Any dielectric material that can be employed for the first insulating layers 132 may be employed for the first component dielectric material. The first inter-tier dielectric component layer 171 is a dielectric material layer that is subsequently incorporated into an inter-tier dielectric layer as a component layer. In one embodiment, the first inter-tier dielectric component layer 171 includes the same dielectric material as the first insulating layers 132. For example, the first inter-tier dielectric component layer 171 can include a first silicon oxide material such as undoped silicate glass. The first inter-tier dielectric component layer 171 may be deposited by a conformal or non-conformal deposition process. For example, the first inter-tier dielectric component layer 171 can be deposited by plasma enhanced physical vapor deposition. The thickness of the first inter-tier dielectric component layer 171 can be in a range from 80 nm to 400 nm, although lesser and greater thicknesses can also be employed.

Figure 3:
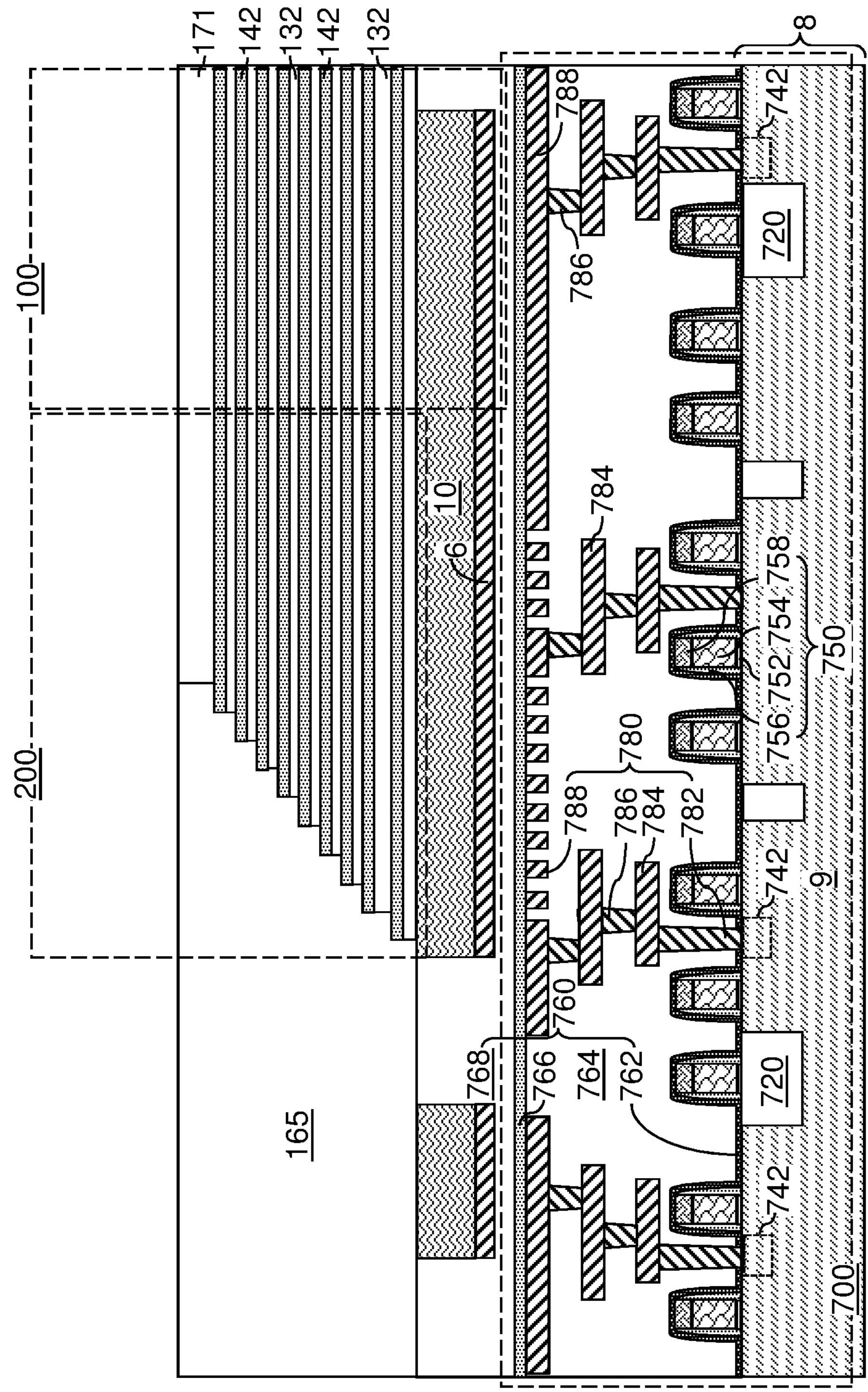
FIG. 3 is a vertical cross-sectional view of the first exemplary structure after patterning first-tier staircase regions on the first alternating stack and forming a first-tier retro-stepped dielectric material portion according to the first embodiment of the present disclosure.

Referring to FIG. 3, the first inter-tier dielectric component layer 171 and the first alternating stack (132, 142) can be patterned to form first stepped surfaces in the word line contact region 200. The word line word line contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first inter-tier dielectric component layer 171, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165.

As used herein, a "retro-stepped" element refers to an element that has stepped surfaces and a horizontal cross-sectional area that increases monotonically as a function of a vertical distance from a top surface of a substrate on which the element is present. The first alternating stack (132, 142) and the first-tier retro-stepped dielectric material portion 165 collectively constitute a first-tier structure, which is an in-process structure that is subsequently modified. In one embodiment, the dielectric material of the first-tier retro-stepped dielectric material portion 165 may be the same as the dielectric material of the first inter-tier dielectric component layer 171. For example, the first-tier retro-stepped dielectric material portion 165 and the first inter-tier dielectric component layer 171 can include undoped silicate glass composed primarily of silicon oxide and including hydrogen and/or carbon at concentrations in a range from 0.1 part per million to 100 parts per million each.

Figure 4A:
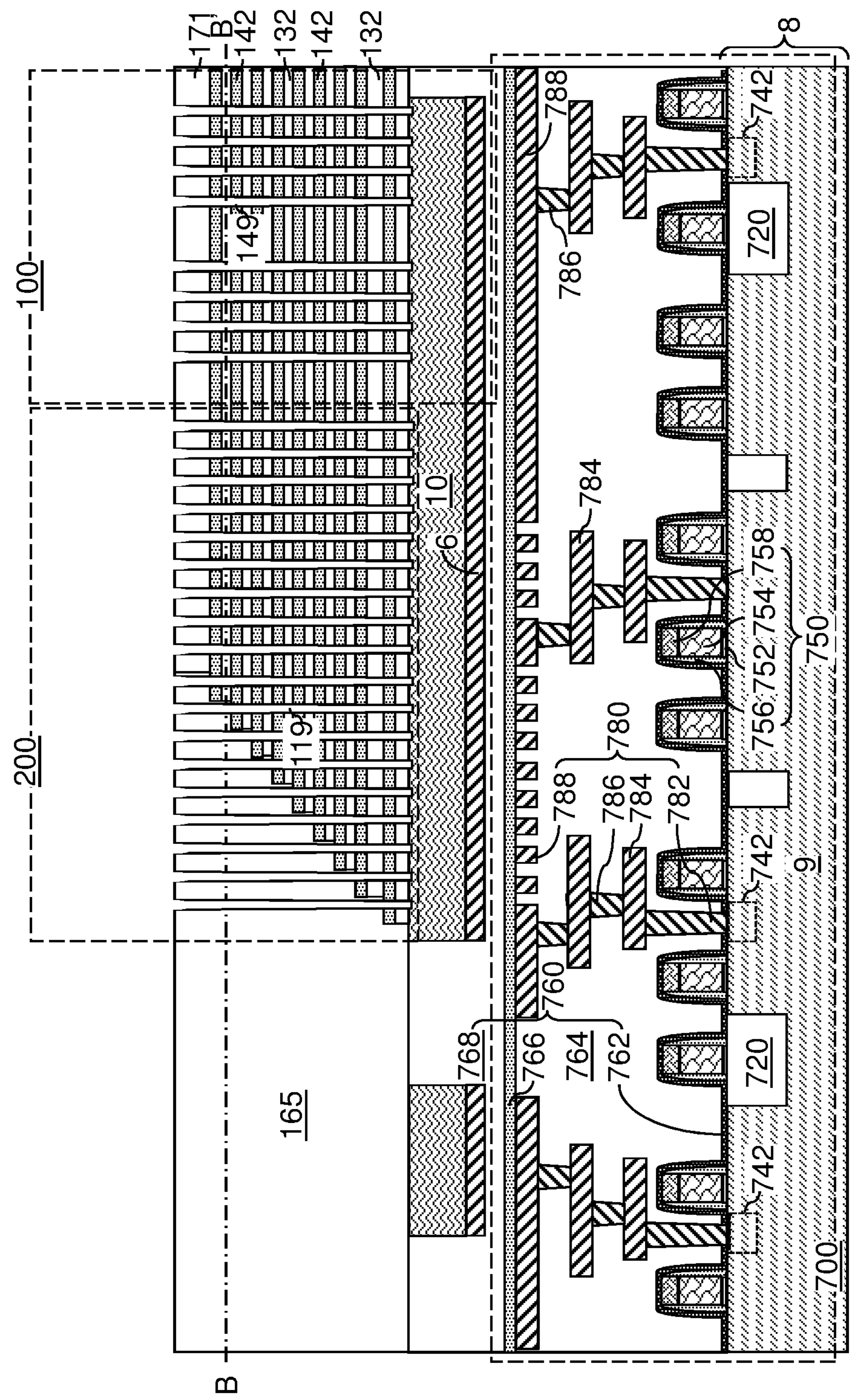
FIG. 4A is a vertical cross-sectional view of the first exemplary structure after formation of first-tier memory openings and first-tier support openings according to the first embodiment of the present disclosure.
Figure 4B:
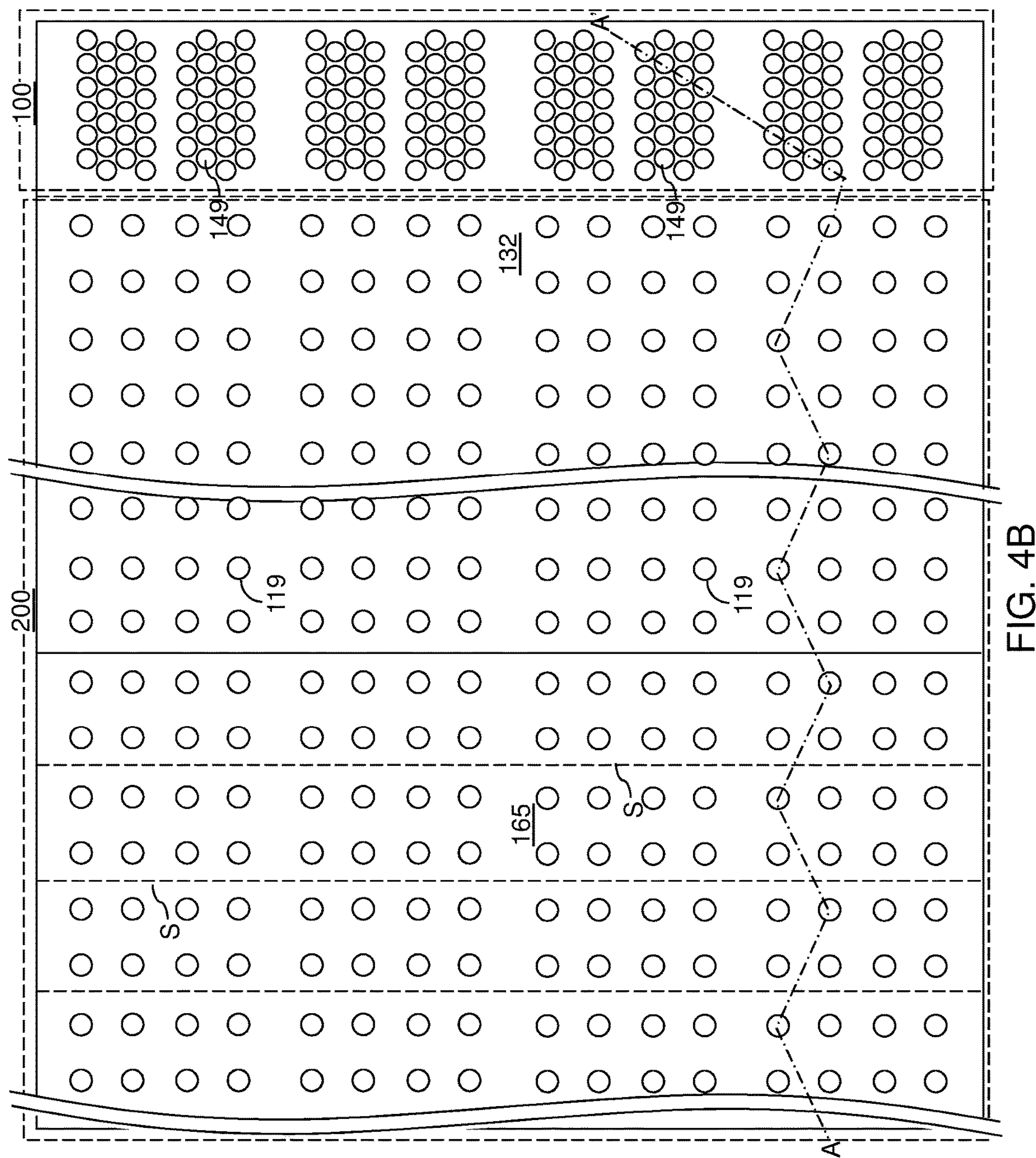
FIG. 4B is a horizontal cross-sectional view of the first exemplary structure along the horizontal plane B-B' in FIG. 4A. The zig-zag vertical plane A-A' corresponds to the plane of the vertical cross-sectional view of FIG. 4A.

Referring to FIGS. 4A and 4B, first-tier memory openings 149 and first-tier support openings 119 can be formed. The first-tier memory openings 149 and the first-tier support openings 119 extend through the first alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line word line contact region 200. For example, a lithographic material stack (not shown) including at least a photoresist layer can be formed over the first inter-tier dielectric component layer 171, and can be lithographically patterned to form openings within the lithographic material stack. The pattern in the lithographic material stack can be transferred through the first inter-tier dielectric component layer 171, and through the entirety of the first alternating stack (132, 142) by at least one anisotropic etch that employs the patterned lithographic material stack as an etch mask. Portions of the first inter-tier dielectric component layer 171 and the first alternating stack (132, 142) underlying the openings in the patterned lithographic material stack are etched to form the first-tier memory openings 149 and the first-tier support openings 119. In other words, the transfer of the pattern in the patterned lithographic material stack through the first inter-tier dielectric component layer 171 and the first alternating stack (132, 142) forms the first-tier memory openings 149 and the first-tier support openings 119.

In one embodiment, the chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches or a single etch (e.g., a $CF_4/O_2/Ar$ reactive ion etch). The sidewalls of the first-tier memory openings 149 and the support openings 119 can be substantially vertical, or can be tapered. Subsequently, the patterned lithographic material stack can be subsequently removed, for example, by ashing.

Figure 5:
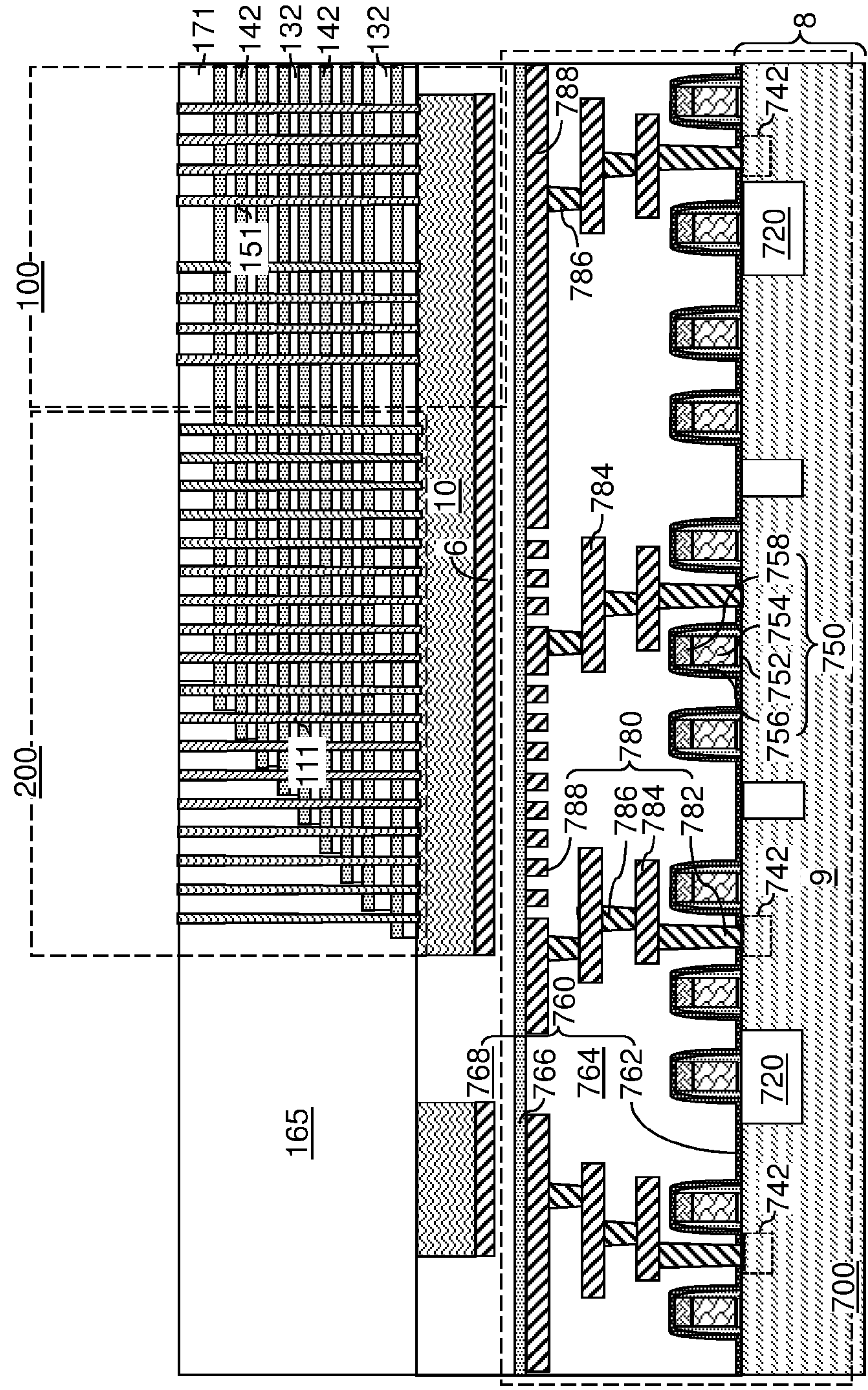
FIG. 5 is a vertical cross-sectional view of the first exemplary structure after formation of sacrificial memory opening pillar structures and sacrificial support opening pillar structures according to the first embodiment of the present disclosure.
Figure 6A:
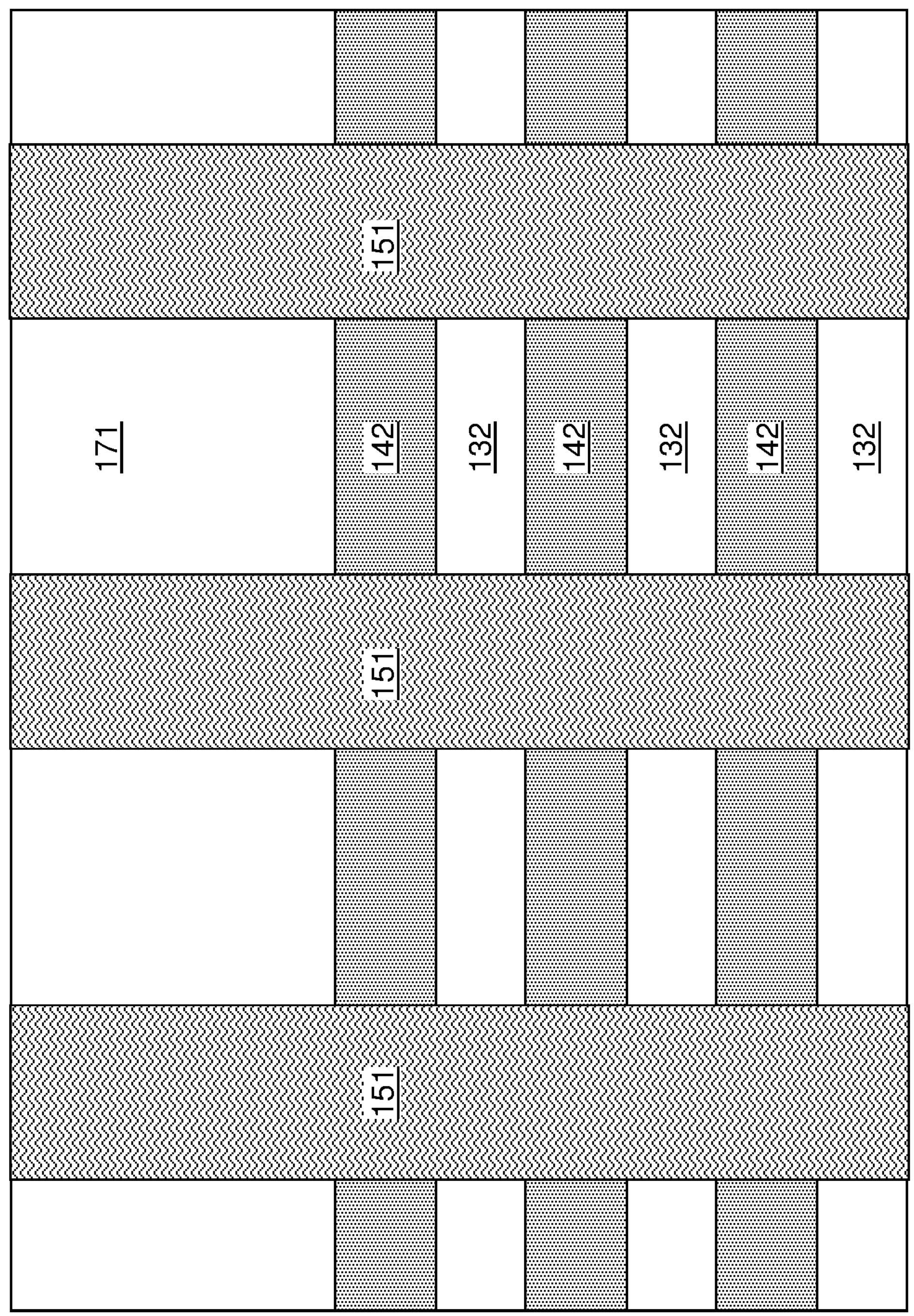
FIGS. 6A-6E are sequential vertical cross-sectional views of a region of the first exemplary structure during formation of an inter-tier dielectric layer, sacrificial memory opening fill structures, and sacrificial support opening fill structures according to the first embodiment of the present disclosure.

Referring to FIGS. 5 and 6A, sacrificial pillar structures (151, 111) are formed in the first-tier memory openings 149 and the first-tier support openings 119. The sacrificial pillar structures 151 that are formed in the first-tier memory openings 149 are referred to as sacrificial memory opening pillar structures 151. The sacrificial pillar structures 111 that are formed in the first-tier memory openings 119 are referred to as sacrificial support opening pillar structures 111. In other words, sacrificial memory opening pillar structures 151 can be formed in the first-tier memory openings 149, and sacrificial support opening pillar structures 111 can be formed in the first-tier support openings 119. As used herein, a “pillar structure” refers to a structure including a top surface, a bottom surface, and a set of at least one sidewall that completely surrounds a volume between the top surface and the bottom surface. Each sidewall of a pillar structure may be straight and may also be either vertical or have a taper angle less than 10 degrees with respect to a vertical direction.

For example, a sacrificial fill material layer is deposited in the first-tier memory openings 149 and the first-tier support openings 119. The sacrificial fill material layer includes a sacrificial material which can be subsequently removed selective to the materials of the first insulating layers 132 and the first sacrificial material layers 142. In one embodiment, the sacrificial fill material layer can include amorphous silicon, polysilicon, germanium, a silicon-germanium alloy, carbon, borosilicate glass (which provides higher etch rate relative to undoped silicate glass), porous or non-porous organosilicate glass, organic polymer, or inorganic polymer. In one embodiment, the sacrificial fill material layer can include a first sacrificial material selected from a semiconductor material, amorphous carbon, diamond-like carbon, inorganic polymer, and an organic polymer. In one embodiment, the sacrificial fill material layer can include a semiconductor material such as amorphous silicon or polysilicon. Optionally, a thin etch stop layer (such as a silicon oxide layer having a thickness in a range from 1 nm to 3 nm) may be employed prior to depositing the sacrificial fill material layer. If an etch stop layer is employed, semiconductor materials such as amorphous silicon may be employed as the sacrificial fill material. The sacrificial fill material layer may be formed by a non-conformal deposition or a conformal deposition method.

Portions of the deposited sacrificial material can be removed from above the first inter-tier dielectric component layer 171 employing a planarization process. The planarization process can include a recess etch, chemical mechanical planarization (CMP), or a combination thereof. The top surface of the first inter-tier dielectric component layer 171 can be employed as an etch stop layer or a planarization stop layer. Each remaining portion of the sacrificial material in a first-tier memory opening 149 constitutes a sacrificial memory opening pillar structure 151. Each remaining portion of the sacrificial material in a first-tier support opening 119 constitutes a sacrificial support opening pillar structure 111. The top surfaces of the sacrificial memory opening pillar structures 151 and the sacrificial support opening pillar structures 111 can be coplanar with the top surface of the first inter-tier dielectric component layer 171. The sacrificial memory opening pillar structure 151 and the sacrificial support opening pillar structures 111 may, or may not, include cavities therein.

Figure 6B:
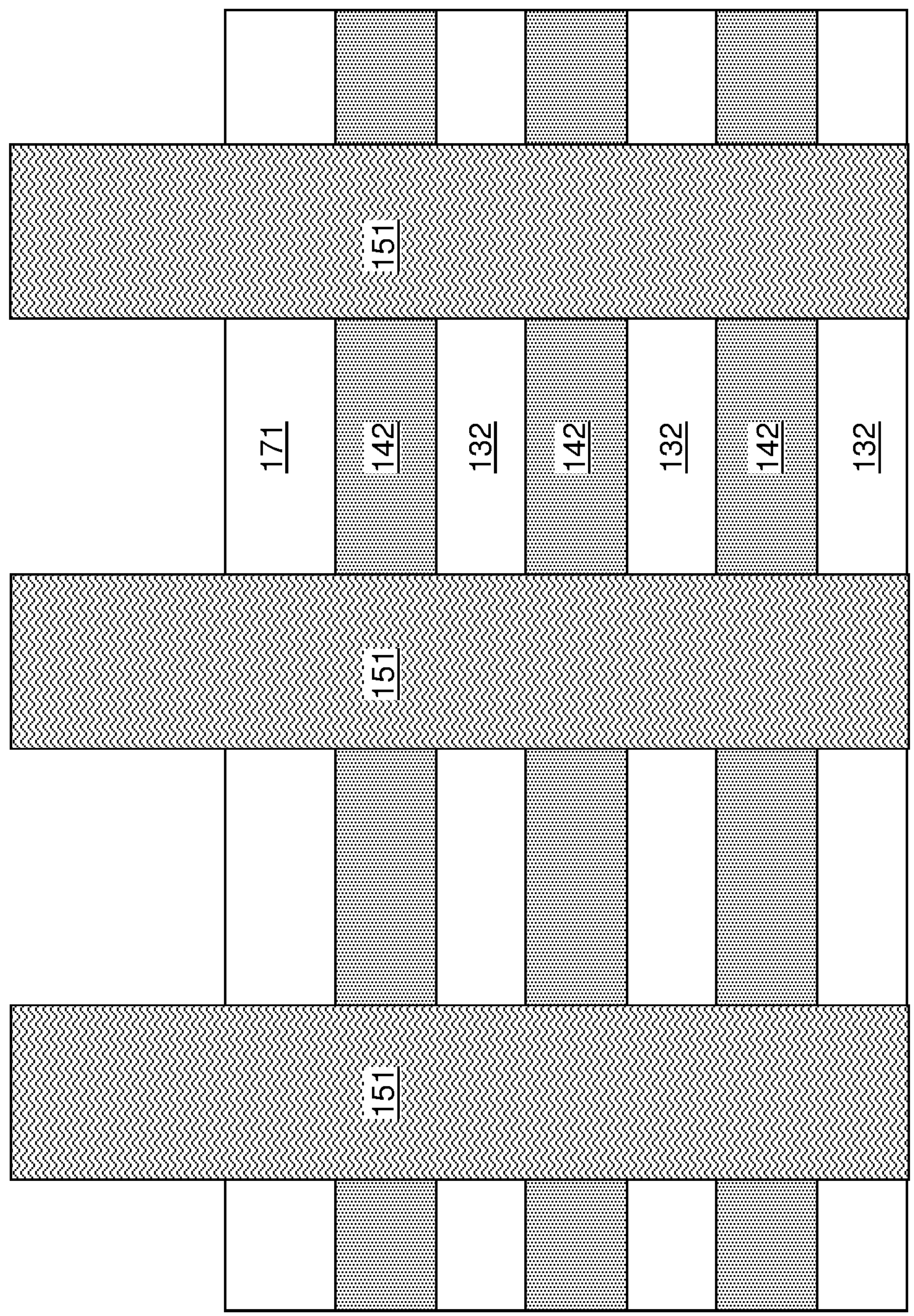

Referring to FIG. 6B, the dielectric material or materials of the first inter-tier dielectric component layer 171 and the first-tier retro-stepped dielectric material portion 165 can be vertically recessed by a recess distance that is less than the thickness of the first inter-tier dielectric component layer 171. An isotropic etch or an anisotropic etch may be employed to recess the first inter-tier dielectric component layer 171. For example, if the first inter-tier dielectric component layer 171 and the first-tier retro-stepped dielectric material portion 165 include silicon oxide, a wet etch process employing hydrofluoric acid can be employed to recess the top surfaces of the first inter-tier dielectric component layer 171 and the first-tier retro-stepped dielectric material portion 165. The recess distance can be in a range from 20% to 90%, such as from 30% to 80%, of the original thickness of the first inter-tier dielectric component layer 171, although lesser and greater percentages can also be employed. Upper portions of the sidewalls of the sacrificial memory opening pillar structures 151 and the sacrificial support opening pillar structures 111 can be physically exposed above the recessed top surface of the first inter-tier dielectric component layer 171. The thickness of first inter-tier dielectric component layer 171 after the vertical recess process can be in a range from 16 nm to 320 nm, such as from 40 nm to 120 nm, although lesser and greater thicknesses can also be employed.

Figure 6C:
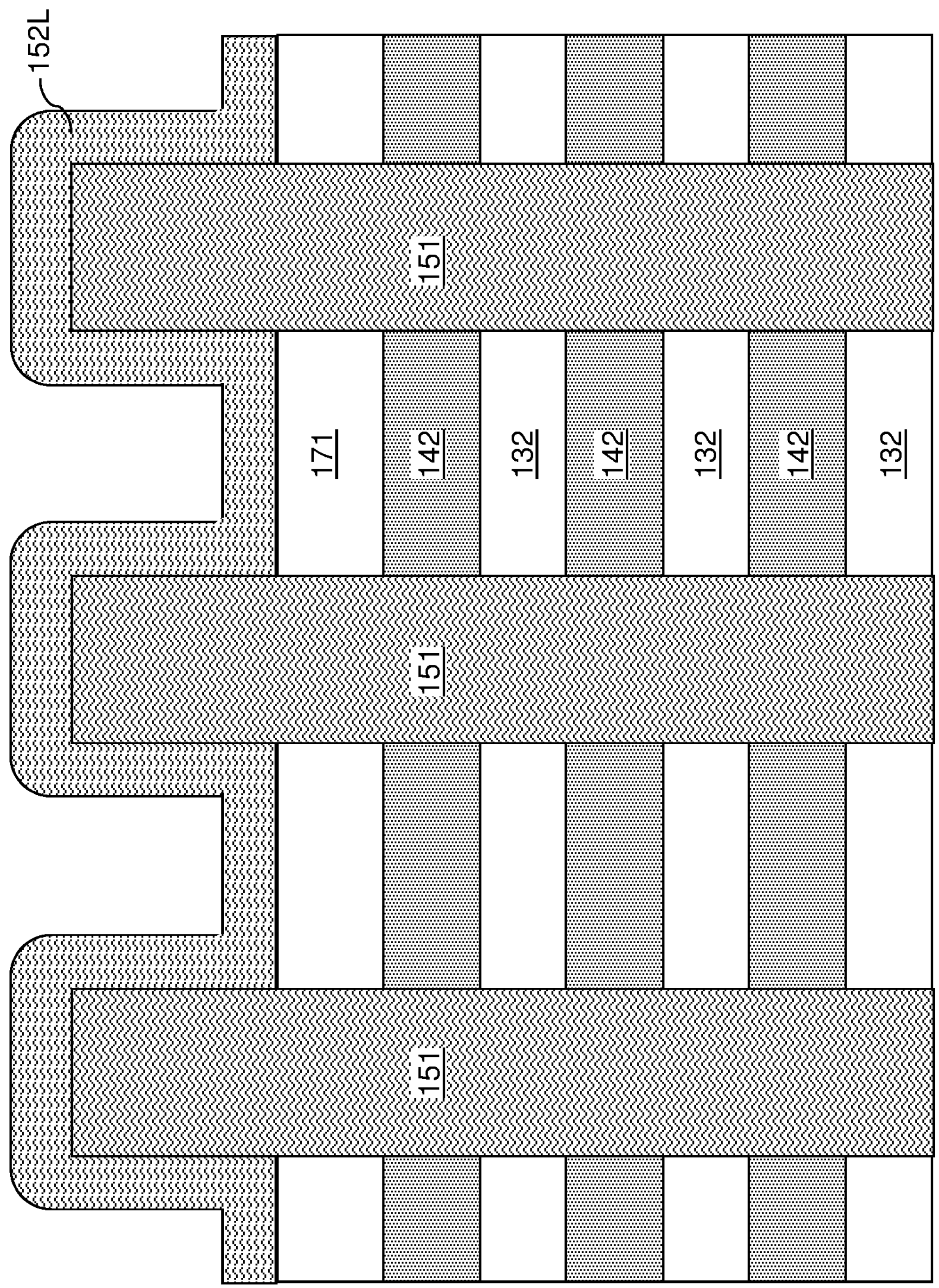

Referring to FIG. 6C, a sacrificial spacer material layer 152L can be deposited by a conformal deposition process on the top surfaces and physically exposed portions of the sidewalls of the sacrificial memory opening pillar structures 151 and the sacrificial support opening pillar structures 111. The sacrificial spacer material layer 152L includes a sacrificial material that can be removed selective to the materials of the first insulating layers 132, the first sacrificial material layers 142, and the first inter-tier dielectric component layer 171. For example, the sacrificial spacer material layer 152L can include amorphous silicon, polysilicon, germanium, a silicon-germanium alloy, carbon, borosilicate glass (which provides higher etch rate relative to undoped silicate glass), porous or non-porous organosilicate glass, organic polymer, or inorganic polymer. In one embodiment, the sacrificial fill material layer can include a second sacrificial material selected from a semiconductor material (such as amorphous carbon or polysilicon), diamond-like carbon, inorganic polymer, and an organic polymer.

In one embodiment, the sacrificial spacer material layer 152L can include a semiconductor material such as amorphous silicon, polysilicon, germanium, a silicon-germanium alloy. In one embodiment, the sacrificial spacer material layer 152L can include the same material as the sacrificial material of the sacrificial memory opening pillar structures 151 and the sacrificial support opening pillar structures 111. In one embodiment, the sacrificial spacer material layer 152L, the sacrificial memory opening pillar structures 151, and the sacrificial support opening pillar structures 111 can include amorphous silicon. The sacrificial spacer material layer 152L can be deposited, for example, by low pressure chemical vapor deposition. The thickness of the sacrificial spacer material layer 152L is less than one half of the minimum spacing between neighboring pairs of sacrificial memory opening pillar structures 151. For example, the thickness of the sacrificial spacer material layer 152L can be in a range from 10 nm to 200 nm, such as from 20 nm to 100 nm, although lesser and greater thicknesses can also be employed.

Figure 6D:
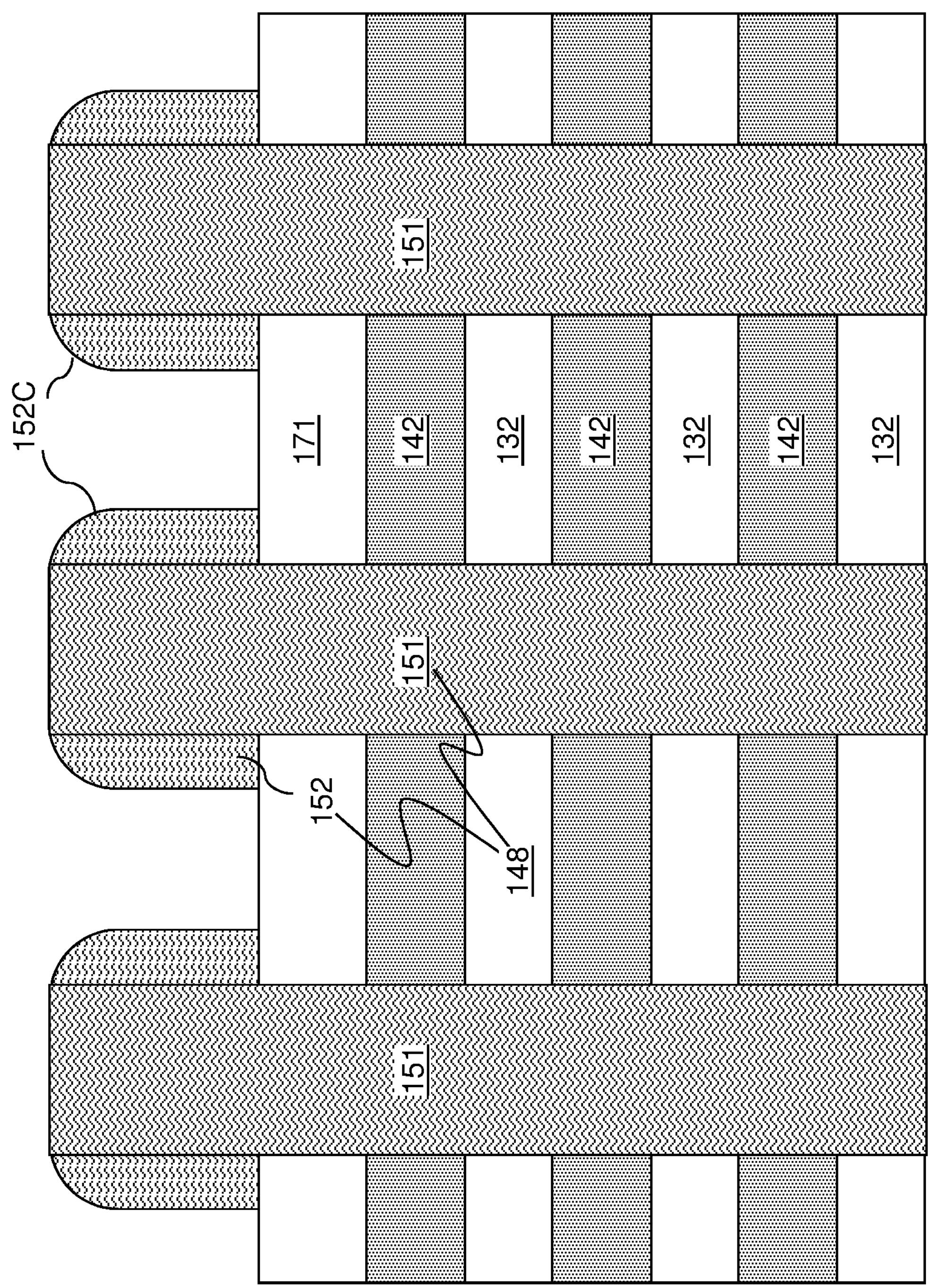

Referring to FIG. 6D, an anisotropic etch process is performed to remove horizontal portions of the sacrificial spacer material layer 152L. The anisotropic etch process etches horizontal portions of the sacrificial spacer material layer 152L and produces rounding of outer corner regions of the vertical portions of the sacrificial spacer material layer 152L through increase in the impingement of reactive ions due to geometrical effects. Sacrificial spacers 152 including convex surfaces 152C at outer upper ends are formed around each of the sacrificial memory opening pillar structures 151 and the sacrificial support opening pillar structures 111. The round convex surfaces 152C the sacrificial spacers 152 are subsequently advantageously employed to remove sharp corners in memory stack structures.

Each combination of a sacrificial spacer 152 and a sacrificial memory opening pillar structure 151 constitutes a sacrificial memory opening fill structure 148. Each combination of a sacrificial spacer 152 and a sacrificial support opening pillar structure 111 constitutes a sacrificial support opening fill structure.

Figure 6E:
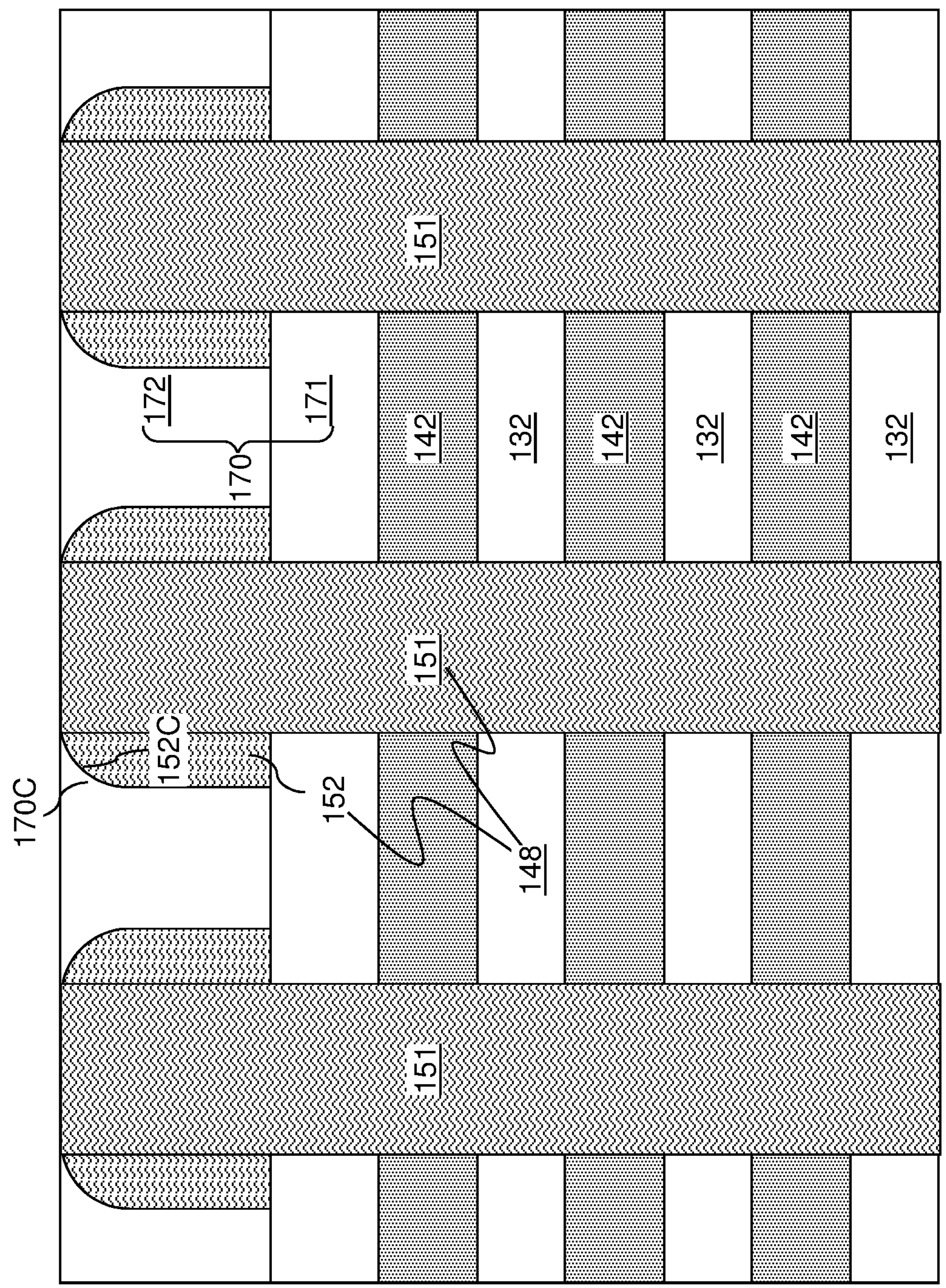

Referring to FIG. 6E, a second inter-tier dielectric component layer 172 is deposited on the first inter-tier dielectric component layer 171 and physically exposed surfaces of the sacrificial memory opening fill structures 148 and the sacrificial support opening fill structure. Thus, the second inter-tier dielectric component layer 172 is deposited on the sidewalls of the sacrificial spacers 152 and the top surfaces of the sacrificial memory opening pillar structures 151 and the sacrificial support opening pillar structures 111. The second inter-tier dielectric component layer 172 includes a dielectric material, which is herein referred to as a second component dielectric material. Any dielectric material that can be employed for the second insulating layers 132 may be employed for the second component dielectric material. The second component dielectric material is deposited on the convex upper surfaces 152C of the sacrificial memory opening fill structures 148 and on the convex surfaces of the sacrificial support opening fill structures.

The second inter-tier dielectric component layer 172 is a dielectric material layer that is subsequently incorporated into an inter-tier dielectric layer as a component layer. In one embodiment, the dielectric material of the second inter-tier dielectric component layer 172 may be the same as, or may be different from, the dielectric material of the first inter-tier dielectric component layer 171. For example, the first inter-tier dielectric component layer 171 can include a first silicon oxide material such as undoped silicate glass, and the second inter-tier dielectric component layer 172 can include a second silicon oxide material such as undoped silicate glass or a doped silicate glass (such as borosilicate glass, phosphosilicate glass, or borophosphosilicate glass). The second inter-tier dielectric component layer 172 may be deposited by a conformal or non-conformal deposition process. For example, the second inter-tier dielectric component layer 172 can be deposited by plasma enhanced physical vapor deposition or low pressure chemical vapor deposition. A densification anneal process may be optionally performed.

The second component dielectric material can be subsequently planarized to provide a planar top surface. In one embodiment, the top surfaces of the sacrificial memory opening fill structure 148 and the support opening fill structures may be employed as a stopping surface. In other words, detection of physical exposure of the top surfaces of the sacrificial memory opening fill structure 148 and the support opening fill structures during a planarization process can be employed as an endpoint signal during the planarization process. The remaining continuous portion of the second component dielectric material constitutes a second inter-tier dielectric component layer 172. The combination of the first and second inter-tier dielectric component layers (171, 172) constitute an inter-tier dielectric layer 170. The top surface of the inter-tier dielectric layer 170 may be coplanar with the top surfaces of the sacrificial memory opening fill structure 148 and the support opening fill structures. Thus, a combination of the inter-tier dielectric layer 170 and sacrificial memory opening fill structures 148 are formed. Each of the sacrificial memory opening fill structures 148 extends through the first alternating stack (132, 142) and the inter-tier dielectric layer 170. A concave downward-facing surface 170C of the inter-tier dielectric layer is formed on each convex upper surface 152C of the sacrificial memory opening fill structures 148. Structures formed above the horizontal plane including the top surface of the planar semiconductor layer 10 up to the processing steps of FIG. 6E collectively constitute a first-tier structure (132, 142, 170, 151, 152, 111).

Figure 7:
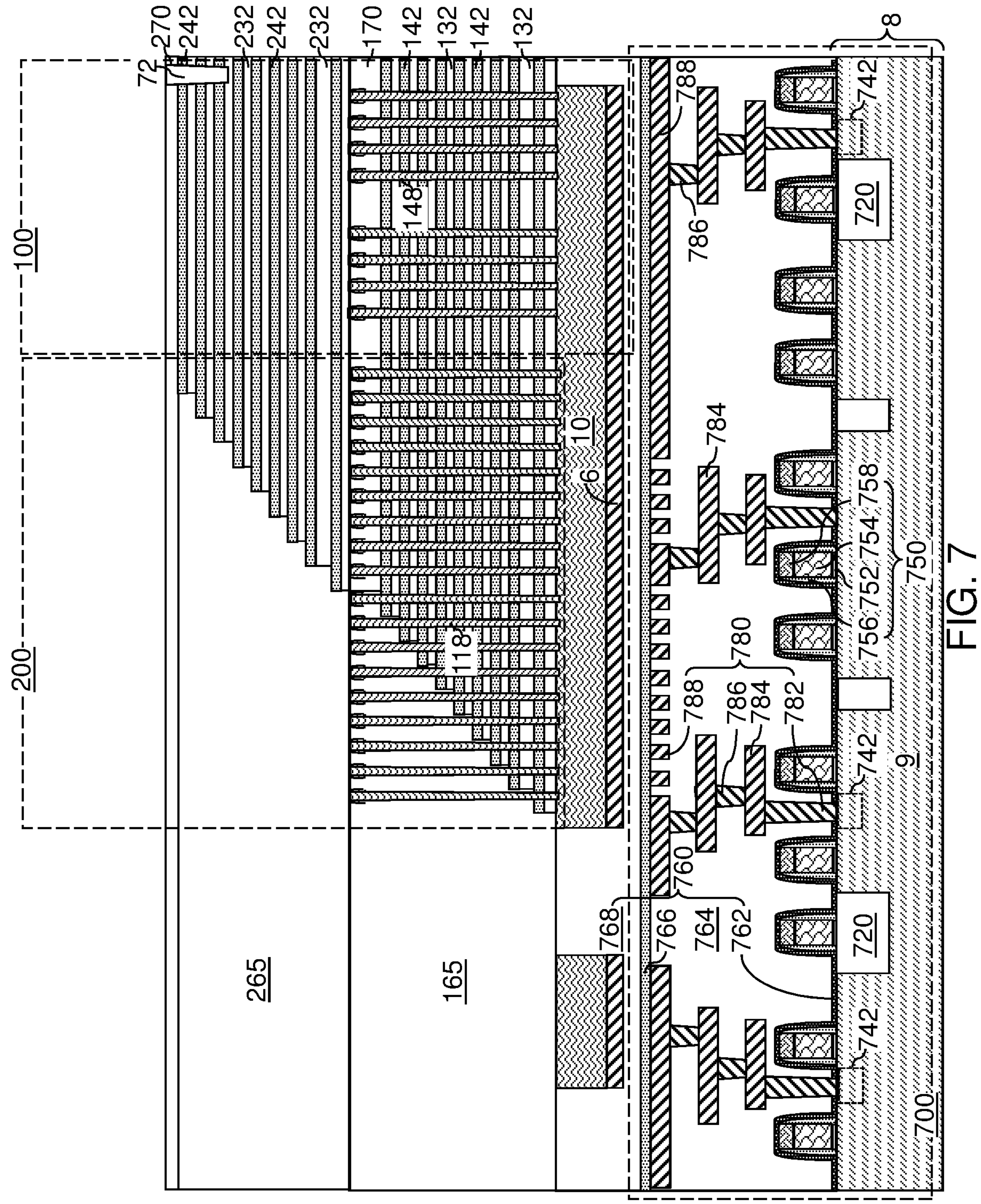
FIG. 7 is a vertical cross-sectional view of the first exemplary structure after formation of a second alternating stack of second insulating layers and second spacer material layers, a second-tier retro-stepped dielectric material portion, and a second insulating cap layer according to the first embodiment of the present disclosure.

Referring to FIG. 7, sacrificial memory opening fill structures 148 and sacrificial support opening fill structures 118 extend through the first alternating stack (132, 142) and the inter-tier dielectric layer 170. A second-tier structure can be formed over the first-tier structure (132, 142, 170, 151, 152, 111). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line word line contact region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line word line contact region 200.

An insulating cap layer 270 can be subsequently formed over the second alternating stack (232, 242). The insulating cap layer 270 includes a dielectric material that is different from the material of the second sacrificial material layers 242. In one embodiment, the insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 8A:
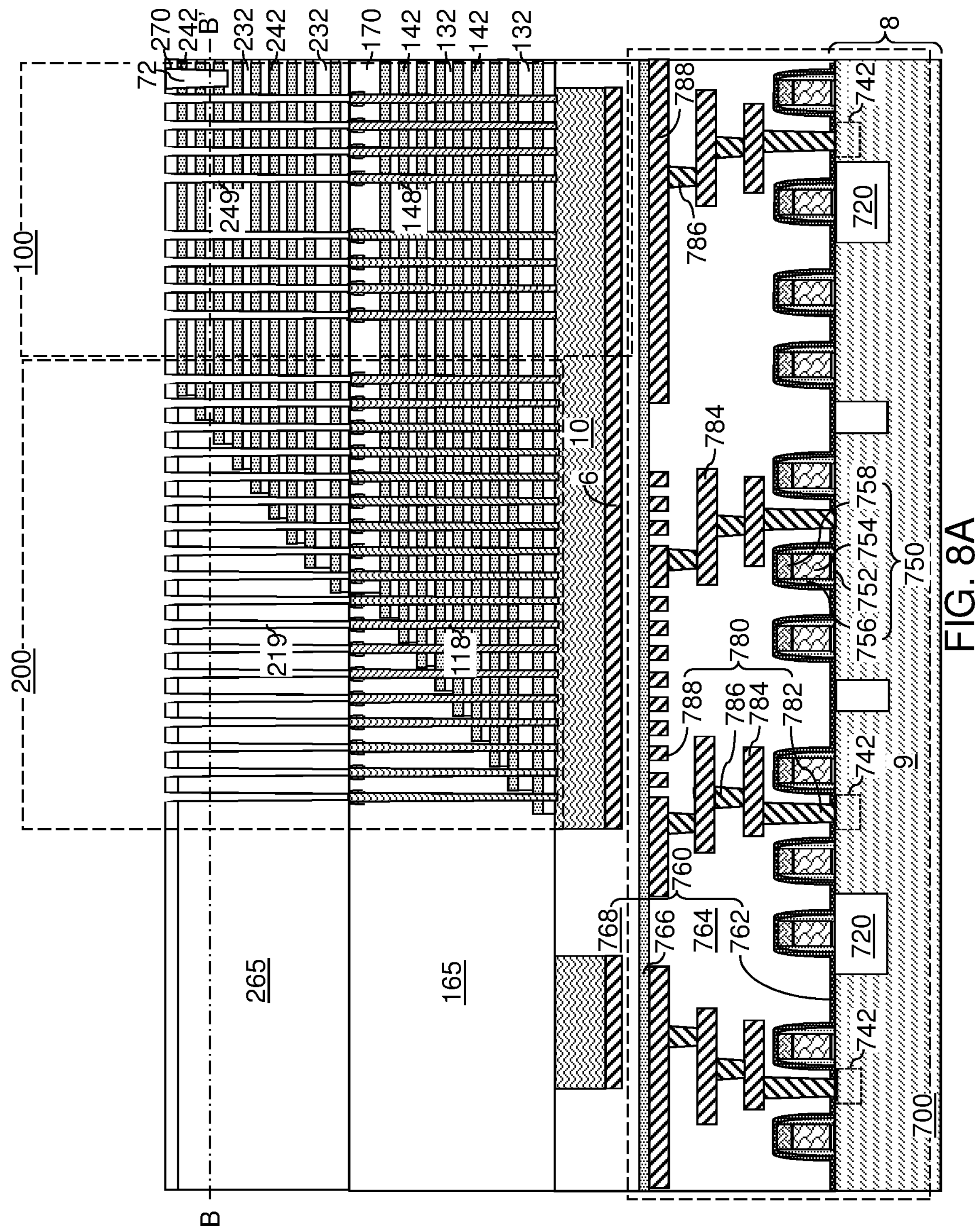
FIG. 8A is a vertical cross-sectional view of the first exemplary structure after formation of second-tier memory openings and second-tier support openings according to the first embodiment of the present disclosure.
Figure 8B:
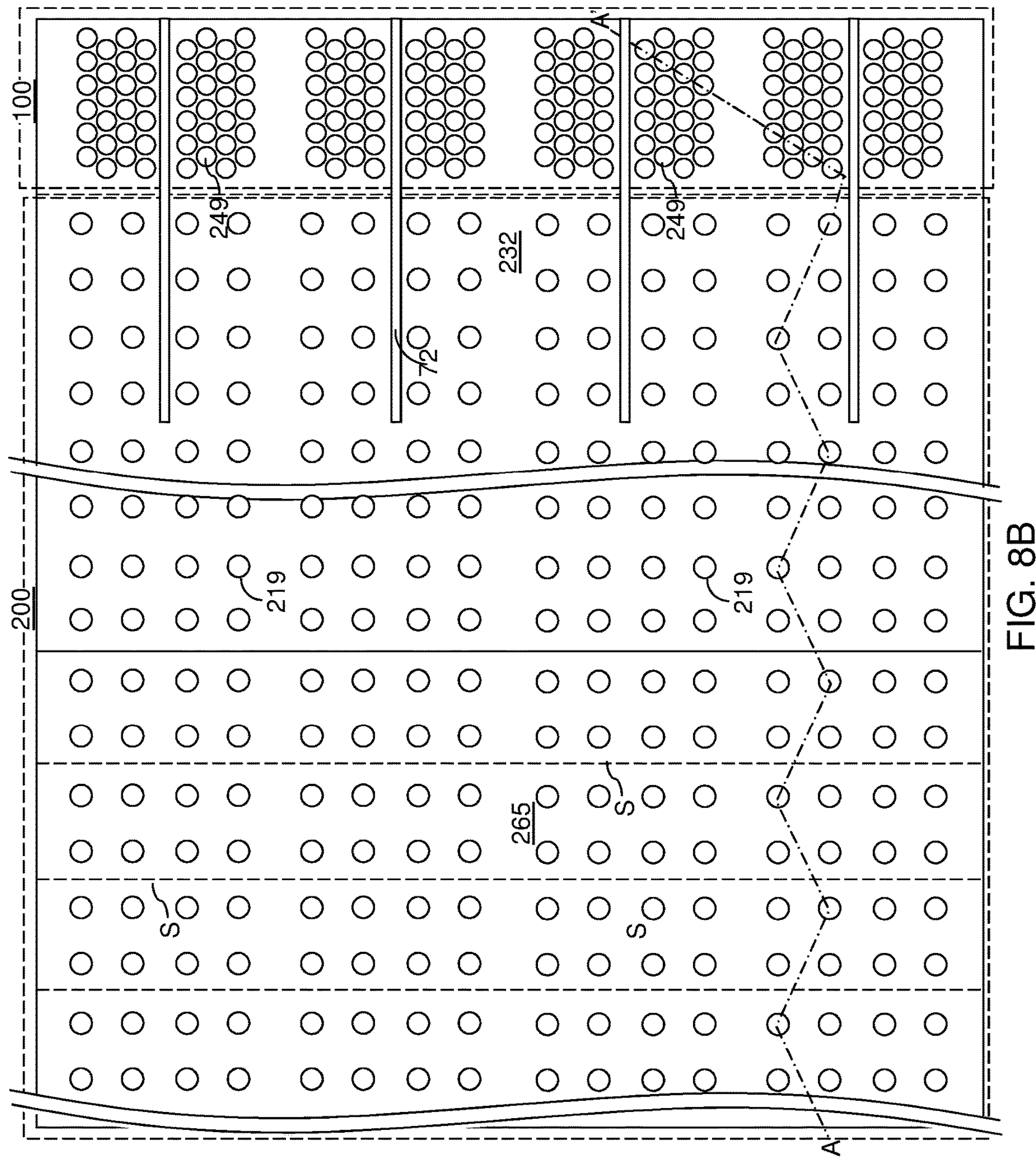
FIG. 8B is a horizontal cross-sectional view of the first exemplary structure along the horizontal plane B-B' in FIG.

Referring to FIGS. 8A and 8B, second-tier memory openings 249 and second-tier support openings 219 extending through the second-tier structure (232, 242, 270, 265) are formed in areas overlying the sacrificial fill structures (148, 118). A photoresist layer can be applied over the second-tier structure (232, 242, 270, 265), and can be lithographically patterned to form a same pattern as the pattern of the sacrificial memory opening pillar structures 151 and the sacrificial support opening pillar structures 111, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second alternating stack (232, 242) can alternate to optimize etching of the alternating material layers in the second alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill structure 148 can be physically exposed at the bottom of each second-tier memory opening 249. A top surface of an underlying sacrificial support opening fill structure 118 can be physically exposed at the bottom of each second-tier support opening 219. After the top surfaces of the sacrificial memory opening fill structures 148 and the sacrificial support opening fill structures 118 are physically exposed, an etch process can be performed, which removes the sacrificial materials of the sacrificial memory opening fill structures 148 and the sacrificial support opening fill structures 118 selective to the materials of the second alternating stack (232, 242) and the first alternating stack (132, 142). For example, if the sacrificial fill structures (148, 118) include a semiconductor material such as amorphous silicon or a silicon-containing alloy, an anisotropic etch process employing $C_4F_8$, $O_2$, and Ar may be employed.

Upon removal of the sacrificial memory opening fill structures 148, each vertically adjoining pair of a second-tier memory opening 249 and a first-tier memory opening 149 forms a continuous cavity that extends through the first alternating stack (132, 142) and the second alternating stack (232, 242). Likewise, upon removal of the sacrificial support opening fill structures 118, each vertically adjoining pair of a second-tier support opening 219 and a first-tier support opening 119 forms a continuous cavity that extends through the first alternating stack (132, 142) and the second alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first alternating stack (132, 142) and the second alternating stack (232, 242) are illustrated as dotted lines.

Referring to FIG. 9, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 10A-10H provide sequential cross-sectional views of a memory opening 49 or a support opening (119, 219)

during formation of a memory opening fill structure 58 or a support pillar structure 20. While a structural change in a memory opening 49 is illustrated in FIGS. 10A-10H, it is understood that the same structural change occurs in each memory openings 49 and in each of the support openings (119, 219) during the same set of processing steps.

Figures 10A, 10B:
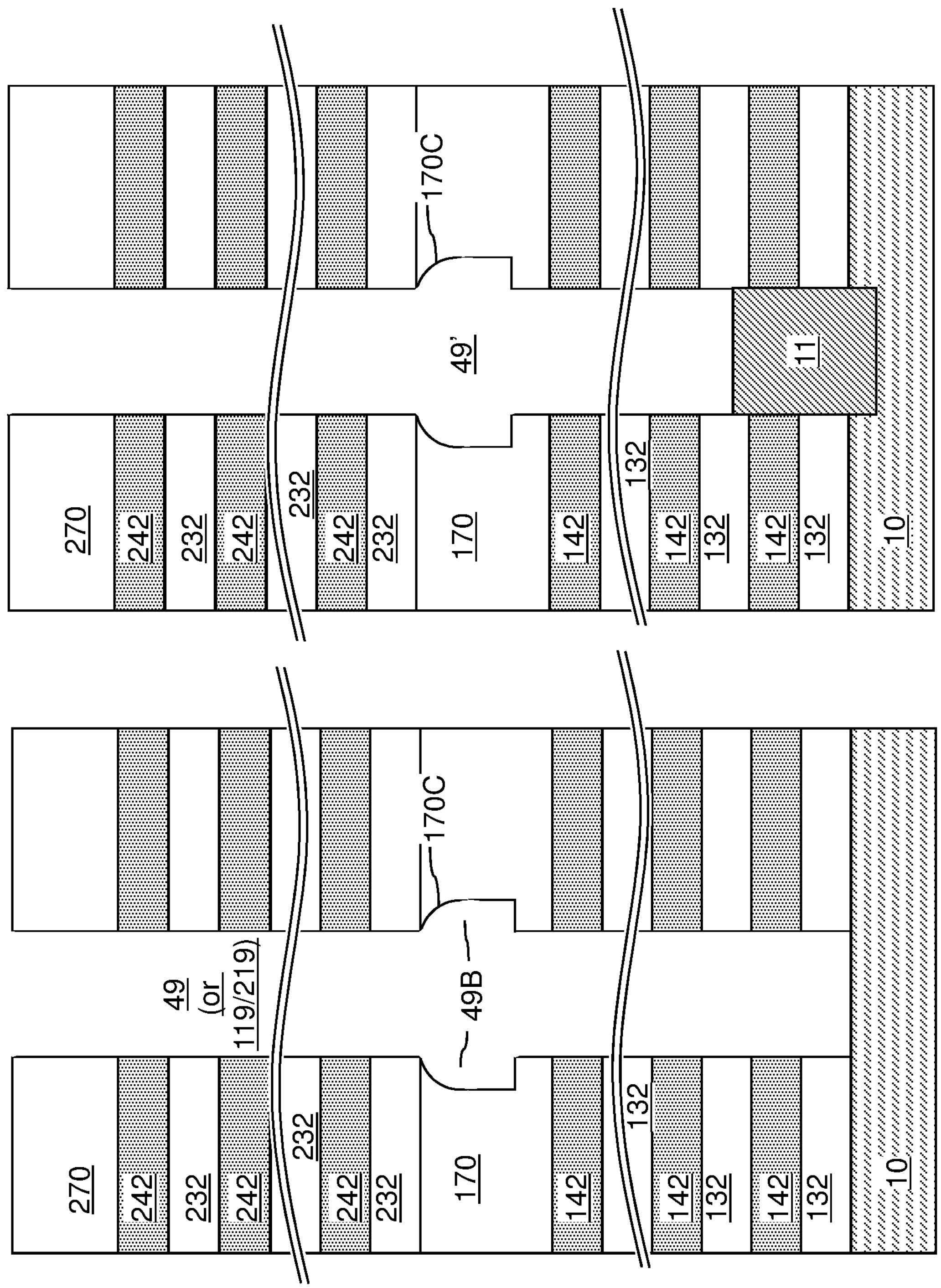

Referring to FIG. 10A, a memory opening 49 in the exemplary device structure of FIG. 14 is illustrated. The memory opening 49 extends through the first-tier structure and the second-tier structure. Likewise, each support opening (119, 219) extends through the first-tier structure and the second-tier structure. Each of the memory openings 49 and the support openings (119, 219) has a laterally bulging portion 49B at the level of the inter-tier dielectric layer 170 such that the laterally bulging portion 49B has a rounded upper surface 170C.

The angle at which a second-tier memory opening 249 adjoins the laterally bulging 49B portion may be 90 degrees if a sidewall of the second-tier memory opening 249 adjoins a horizontal top surface of an underlying sacrificial memory opening fill structure at the processing steps of FIGS. 8A and 8B, or may be greater than 90 degrees if a sidewall of the second-tier memory openings 249 adjoins a convex top surface 152C of a sacrificial spacer 152 at the processing steps of FIGS. 8A and 8B. The angle at which a second-tier memory opening 249 adjoins the laterally bulging portion 49B depends on the location at which a second-tier memory opening 249 joins the laterally bulging portion 49B, and is affected by the lithographic alignment between the patterns of the second-tier openings (249, 219) relative to the pattern of the first-tier openings (149, 119). Generally, misalignment induces increase in the angle between a distal sidewall of a second-tier memory opening 249 and the laterally bulging portion 49B. As used herein, a distal sidewall of the second-tier memory openings 249 refers to the portion of the sidewall of the second-tier memory opening 249 that is distal from a vertical axis passing through a geometrical center of the first-tier memory opening 149 within a same memory opening 49. In one embodiment the width (e.g., diameter) of the second-tier memory opening 249 is greater than the width (e.g., diameter) of the underlying sacrificial memory pillar structures 151 or the first-tier memory opening 149 to avoid sharp inverse curvature regions at the interface between the second-tier memory opening 249 and the bulging region 49B.

Referring to FIG. 10B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Figures 10C, 10D:
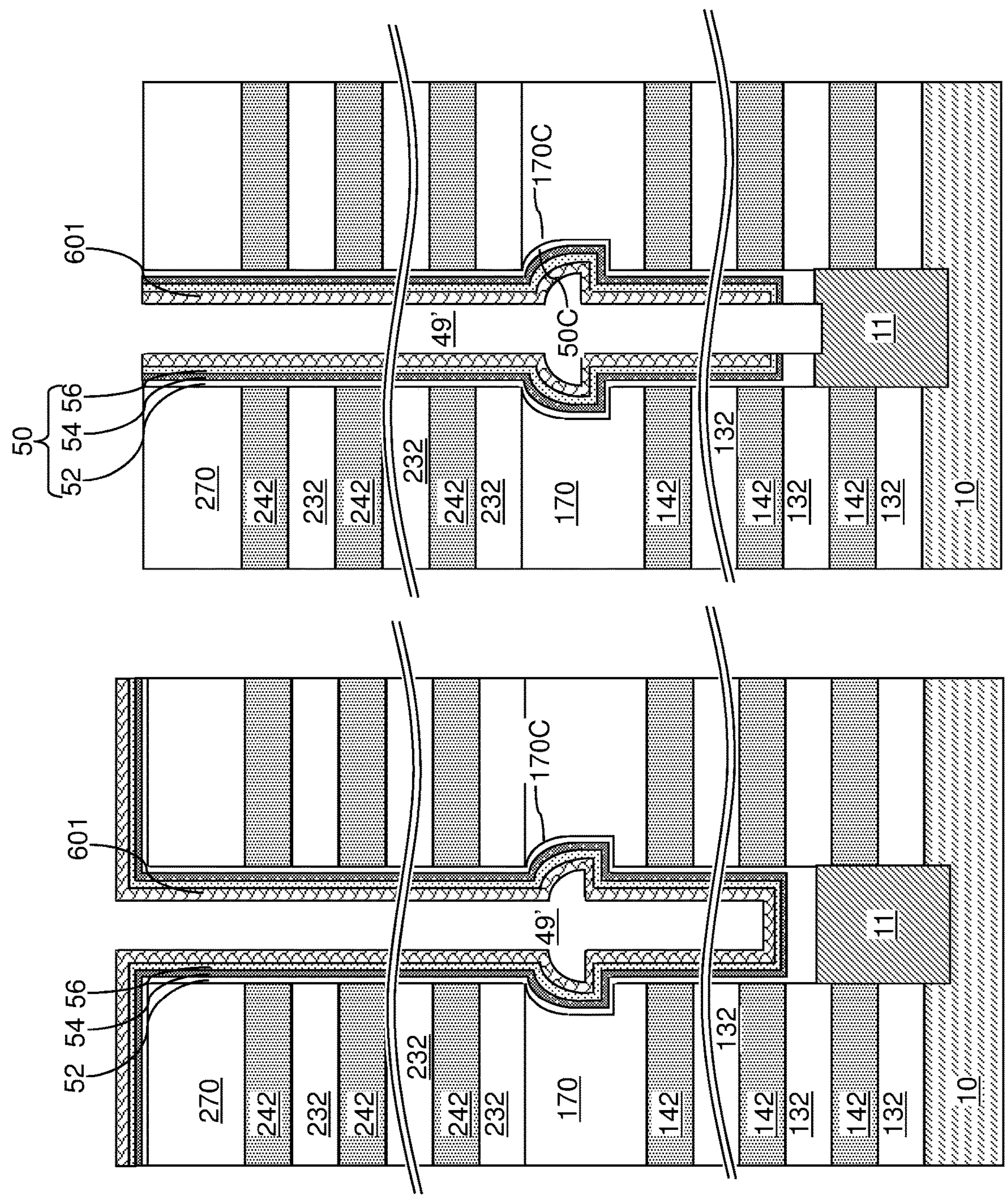

Referring to FIG. 10C, a stack of layers including a blocking dielectric layer 52, a charge storage layer 54, a tunneling dielectric layer 56, and an optional first semiconductor channel layer 601 can be sequentially deposited in the memory openings 49. The outer surface of the stack of layers (52, 54, 56) follow the contour of the concave sidewall of the inter-tier dielectric layer 170. Because the upper region of the laterally bulging portion of the memory opening 49 have a rounded surface, the stack of layers (52, 54, 56) follows the rounded surface, thereby avoiding formation of a geometry that enhances local electrical field.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide (Al2O3), hafnium oxide (HfO2), lanthanum oxide (LaO2), yttrium oxide (Y2O3), tantalum oxide (Ta2O5), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. Alternatively, the blocking dielectric layer 52 can be formed by depositing a silicon nitride layer followed by oxidation of the silicon nitride layer to form a silicon oxide or silicon oxynitride blocking dielectric layer 52. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 10D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls. The memory film 50 comprises an upper portion embedded in the second alternating stack (232, 242), a lower portion embedded in the first alternating stack (132, 142), and an inter-tier level portion located between the upper and lower portions and embedded in the inter-tier dielectric layer 170. The inter-tier level portion laterally protrudes outward relative to outer sidewalls of the upper portion and the lower portion. The inter-tier level portion of the memory film 50 has a convex upper surface 50C that contacts a concave downward-facing surface 170C of the inter-tier dielectric layer 170.

Figures 10E, 10F:
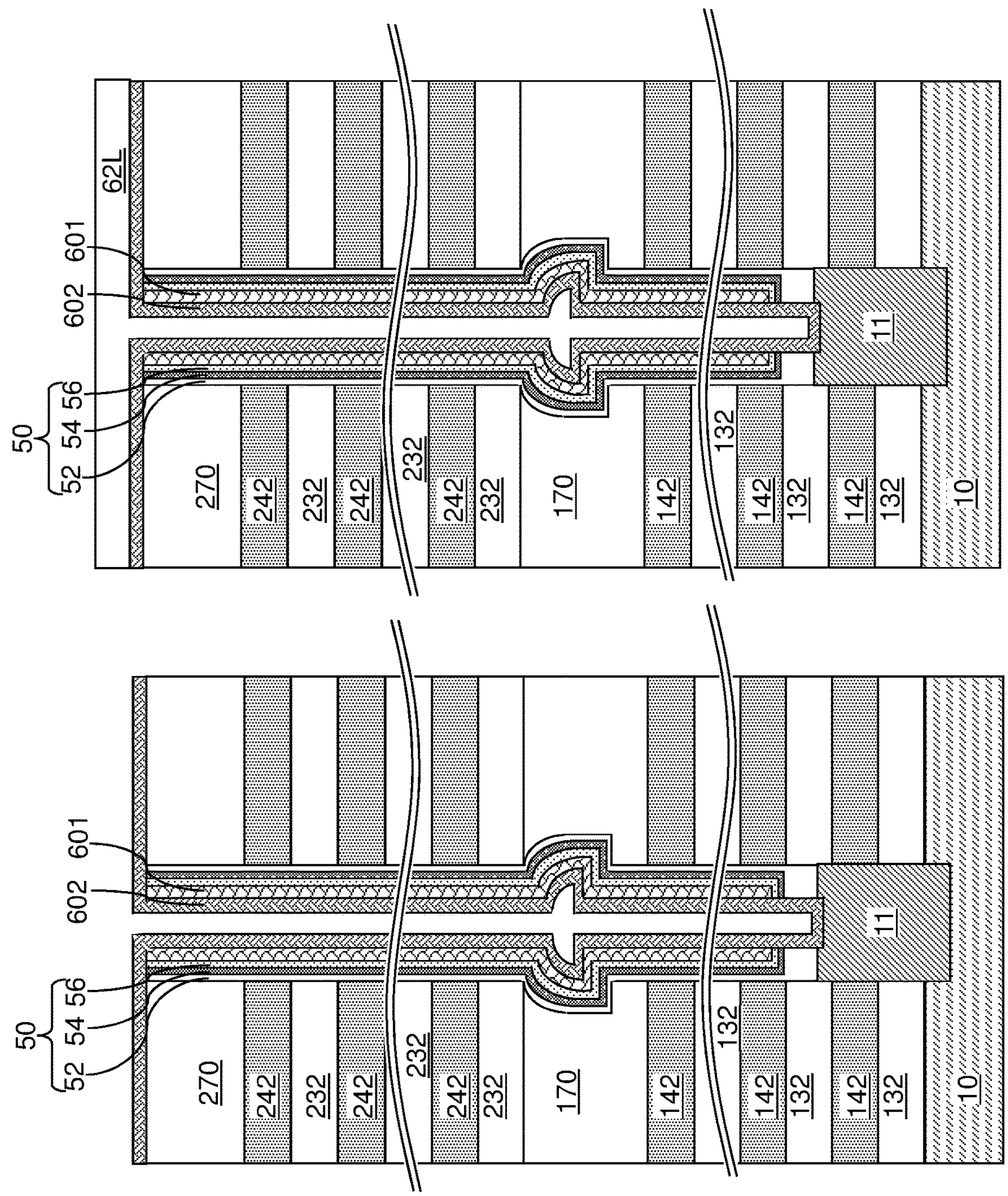

Referring to FIG. 10E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 10F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

The horizontal portion of the dielectric core layer 62L can be removed, for example, by a recess etch from above the top surface of the insulating cap layer 270. Further, the material of the dielectric core layer 62L can be further recessed within each memory opening, for example, by a recess etch to a depth that is located between the top surface of the insulating cap layer 270 and the bottom surface of the insulating cap layer 270. Each remaining portion of the dielectric core layer 62L constitutes a dielectric core 62.

Figure 10H:
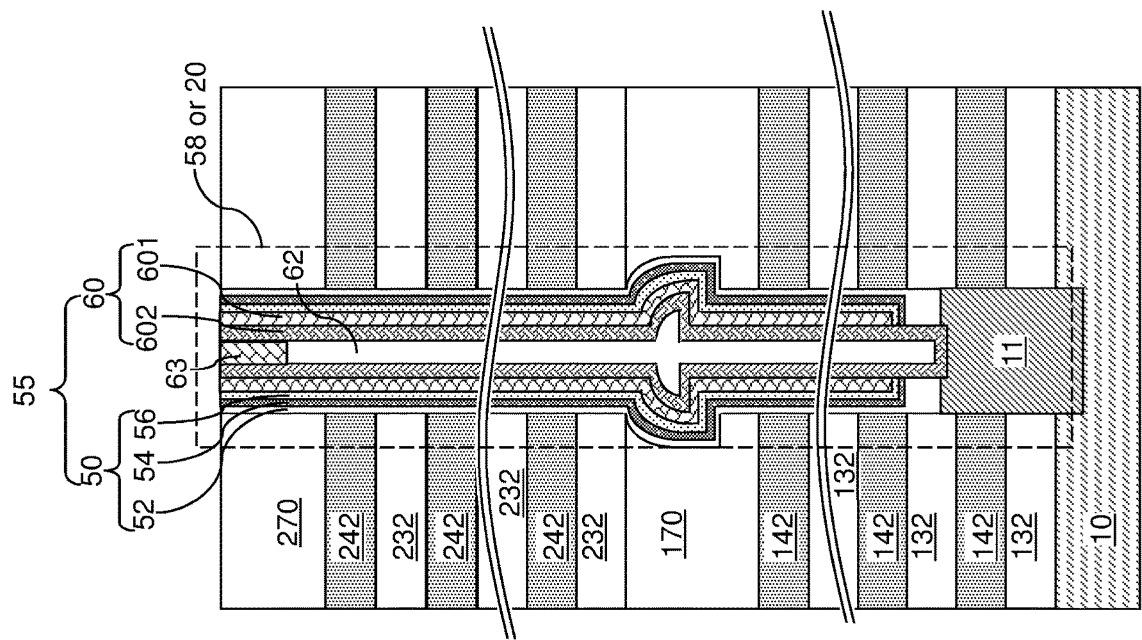
Figure 10G:
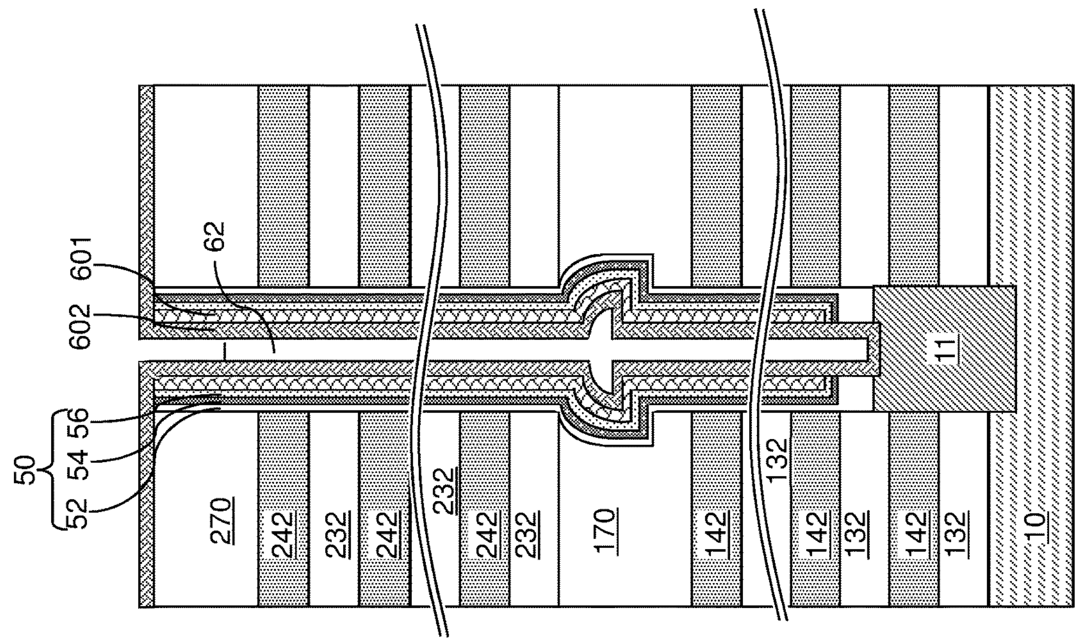

Referring to FIG. 10H, the horizontal portion of the second semiconductor channel layer 602 located above the top surface of the insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from 5.0×1019/cm3 to 2.0×1021/cm3, although lesser and greater dopant concentrations can also be employed. The doped semiconductor material can be, for example, doped polysilicon. Excess portions of the deposited semiconductor material can be removed from above the top surface of the insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Each memory stack structure 58 is formed in a respective inter-tier memory opening 49. Each memory stack structure

58 comprises a memory film 50 and a semiconductor channel 60. The memory film comprises an upper portion embedded in the second alternating stack (232, 242), a lower portion embedded in the first alternating stack (132, 142), and an inter-tier level portion embedded in the inter-tier dielectric layer 170 and having a convex upper surface that contacts the concave downward-facing surface of the inter-tier dielectric layer 170.

Referring to FIGS. 11A and 11B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line word line contact region 200. The first subset of the backside contact trenches 79 laterally divides the memory-level assembly (e.g., into memory blocks).

Referring to FIGS. 12A-12C, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280.

The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Referring to FIGS. 13A and 13B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line word line contact region 200. A subset of the word line contact via structures 86 contacting the second electrically conductive layers 246 extends through the second-tier retro-stepped dielectric material portion 265 in the word line word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line word line contact region 200.

Referring to FIGS. 14A and 14B, through-dielectric via cavities can be formed in the peripheral region through the contact level dielectric layers (280, 282), the retro-stepped dielectric material portions (165, 265), the at least one second dielectric material layer 768, and the silicon nitride layer 766 to a top surface of a respective one of the topmost lower metal liner structures 788. In one embodiment, the through-dielectric via cavities can pass through openings in the planar semiconductor material layer 10 and the optional planar conductive material layer 6.

At least one conductive material can be simultaneously deposited in the through-dielectric via cavities. The at least one conductive material can include, for example, a metallic nitride liner (such as a TiN liner) and a metal fill material (such as W, Cu, Al, Ru, or Co). Excess portions of the at least one conductive material can be removed from outside the through-dielectric via cavities. For example, excess portions of the at least one conductive material can be removed from above the top surface of the second contact level dielectric layer 282 by a planarization process such as chemical mechanical planarization and/or a recess etch. Each remaining portion of the at least one conductive material in the through-dielectric via cavities that contacts a top surface of a respective one of the topmost lower metal line structure 788 constitutes a through-dielectric contact via structure 488.

Referring to FIG. 15, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98). The line level metal interconnect structures (96, 98) can include upper metal line structures 96 that contact a top surface of a respective one of the through-dielectric contact via structures 488 and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the upper metal line structures 96 may contact, or are electrically coupled to, a respective pair of a word line contact via structure 86 and a through-dielectric contact via structure 488. In one embodiment, another subset of the upper metal line structures 96 may be adjoined to a respective one of the bit lines 98, or may be electrically shorted to the respective one of the bit lines 98 through additional metal interconnect structures.

FIGS. 16A-16G are sequential vertical cross-sectional views of a region of a second exemplary structure during formation of an inter-tier dielectric layer and sacrificial memory opening fill structures according to a second embodiment of the present disclosure.

Figure 16A:
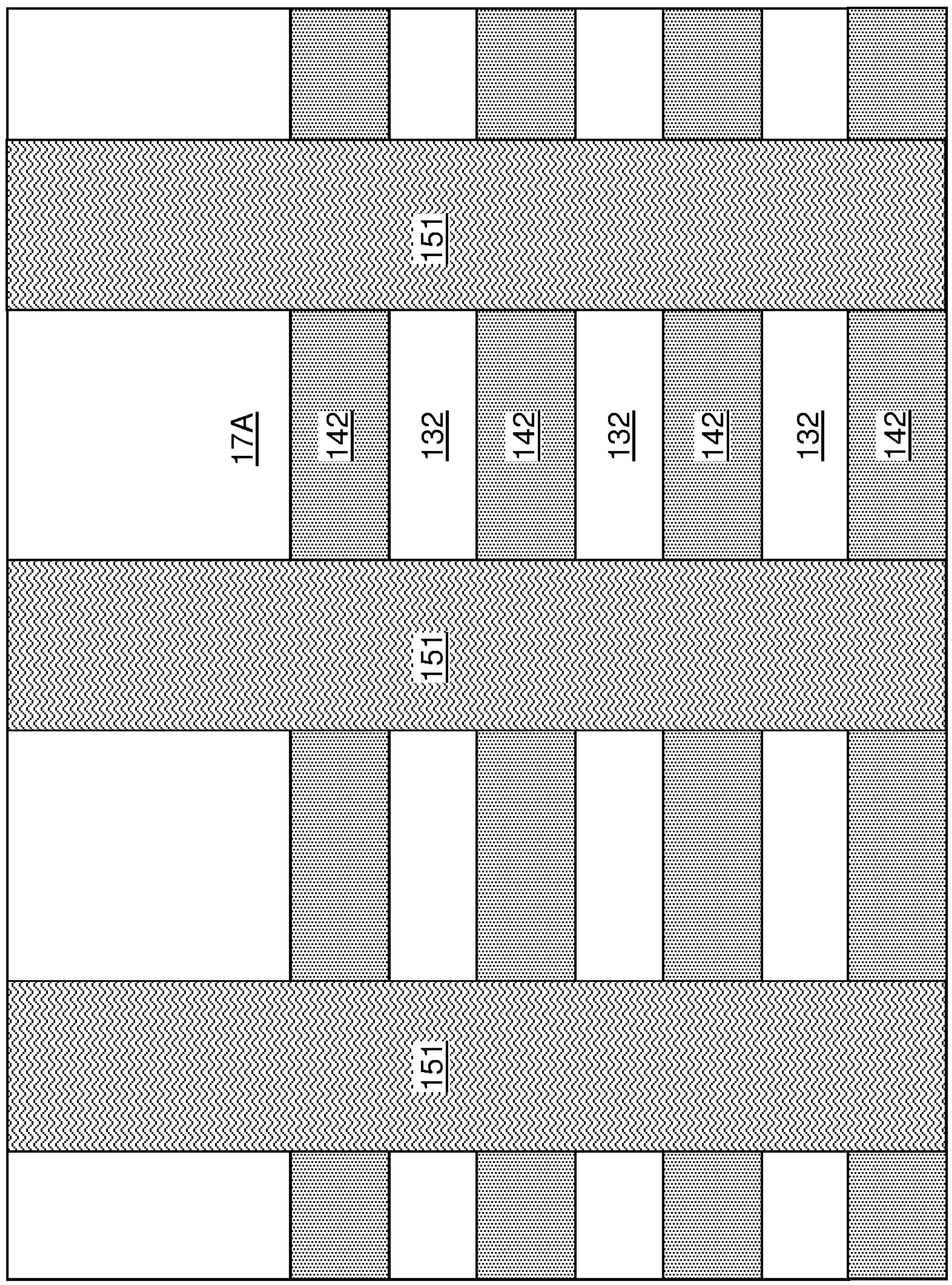

Referring to FIG. 16A, the second exemplary structure can be derived from the first exemplary structure of FIGS. 5 and 6A of the first embodiment of the present disclosure. In the second embodiment, an inter-tier dielectric template layer 17A is formed in lieu of a first inter-tier dielectric component layer 171 at the processing steps of FIG. 2. The inter-tier dielectric template layer 17A comprises a material that transports oxygen atoms at a greater transport rate than semiconductor material portions to be subsequently formed at a same level. The inter-tier dielectric template layer 17A is a continuous dielectric material layer that is subsequently employed as a template that defines the volumes of semiconductor material portions employed as portions of sacrificial fill structures. The inter-tier dielectric template layer 17A is formed at an inter-tier level, i.e., a level located at a boundary of a first-tier structure and a second-tier structure. In one embodiment, the inter-tier dielectric template layer 17A includes a silicon oxide material such as undoped silicate glass or a doped silicate glass (such as borosilicate glass, phosphosilicate glass, or borophosphosilicate glass). The thickness of the inter-tier dielectric template layer 17A can be in a range from 20 nm to 300 nm, although lesser and greater thicknesses can also be employed. The processing steps of FIGS. 3, 4, and 5 can be subsequently formed to provide the structure illustrated in FIG. 16A, which includes a sacrificial memory opening pillar structure 151 within each first-tier memory opening 49 that extends through the inter-tier dielectric template layer 17A and located over the first alternating stack (132, 142).

Figure 16B:
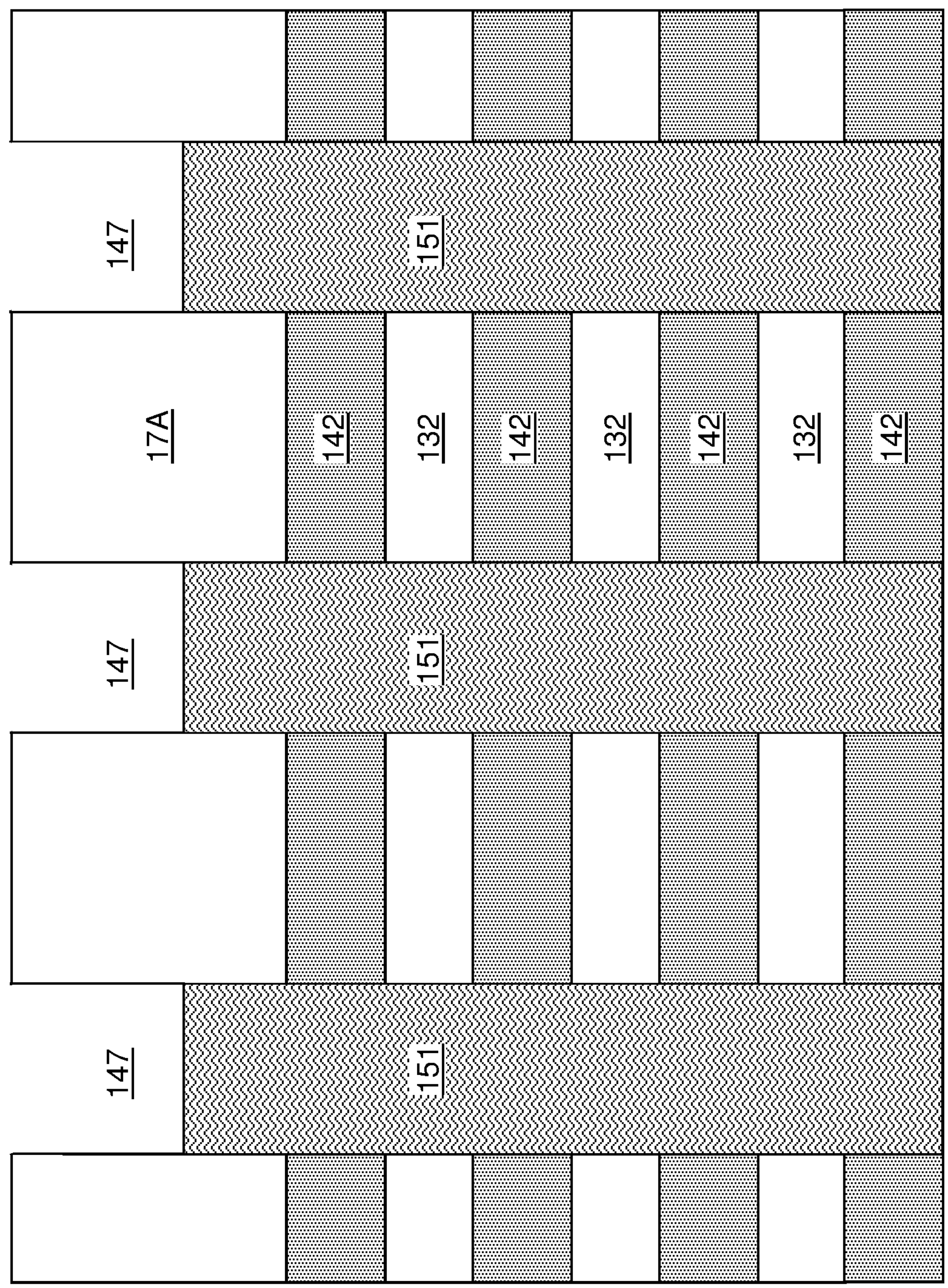

Referring to FIG. 16B, the sacrificial memory opening pillar structures 151 and the sacrificial support opening pillar structures 111 can be vertically recessed below the top surface of the inter-tier dielectric template layer 17A to form recess regions 147. A recess etch process that etches the material of the sacrificial memory opening pillar structures 151 and the sacrificial support opening pillar structures 111 selective to the inter-tier dielectric template layer 17A can be employed to form the recess regions 147. The recess etch process can be an isotropic etch process or an anisotropic etch process. For example, a wet etch can be employed to vertically recess the sacrificial memory opening pillar structures 151 and the sacrificial support opening pillar structures 111. The recessed top surfaces of the sacrificial memory opening pillar structures 151 and the sacrificial support opening pillar structures 111 can be above the horizontal plane including the bottom surface of the inter-tier dielectric template layer 17A.

Figure 16C:
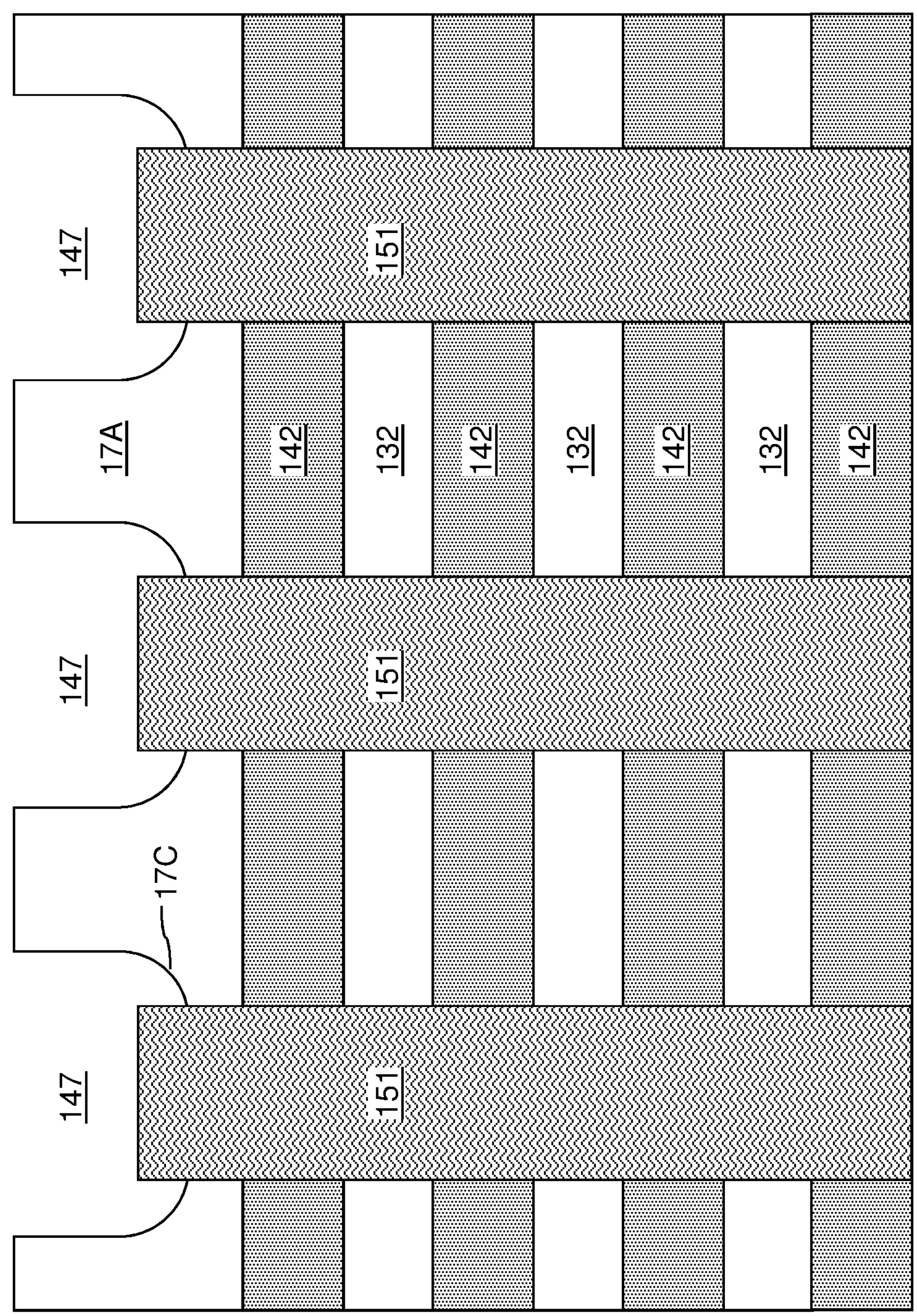

Referring to FIG. 16C, surfaces of the inter-tier dielectric template layer 17A can be subsequently recessed by an isotropic etch process. The sidewalls of the inter-tier dielectric template layer 17A can be isotropically recessed laterally around the recess region 147 to expand the recess region 147. In an illustrative example, if the inter-tier dielectric template layer 17A includes silicon oxide, the sidewalls of the inter-tier dielectric template layer 17A include rounded bottom surfaces 17C that adjoin a respective one of the sacrificial memory opening pillar structures 151 and the sacrificial support opening pillar structures 111. In one embodiment, each sidewall of the inter-tier dielectric template layer 17A can have an annular concave surface 17C that surrounds, and is adjoined to a sidewall of, a respective one of the sacrificial memory opening pillar structures 151 and the sacrificial support opening pillar structures 111. In one embodiment, the lateral recess distance may be the same as the radius of curvature of the of the concave surfaces at the bottom portions of the sidewalls of the inter-tier dielectric template layer 17A.

Figure 16D:
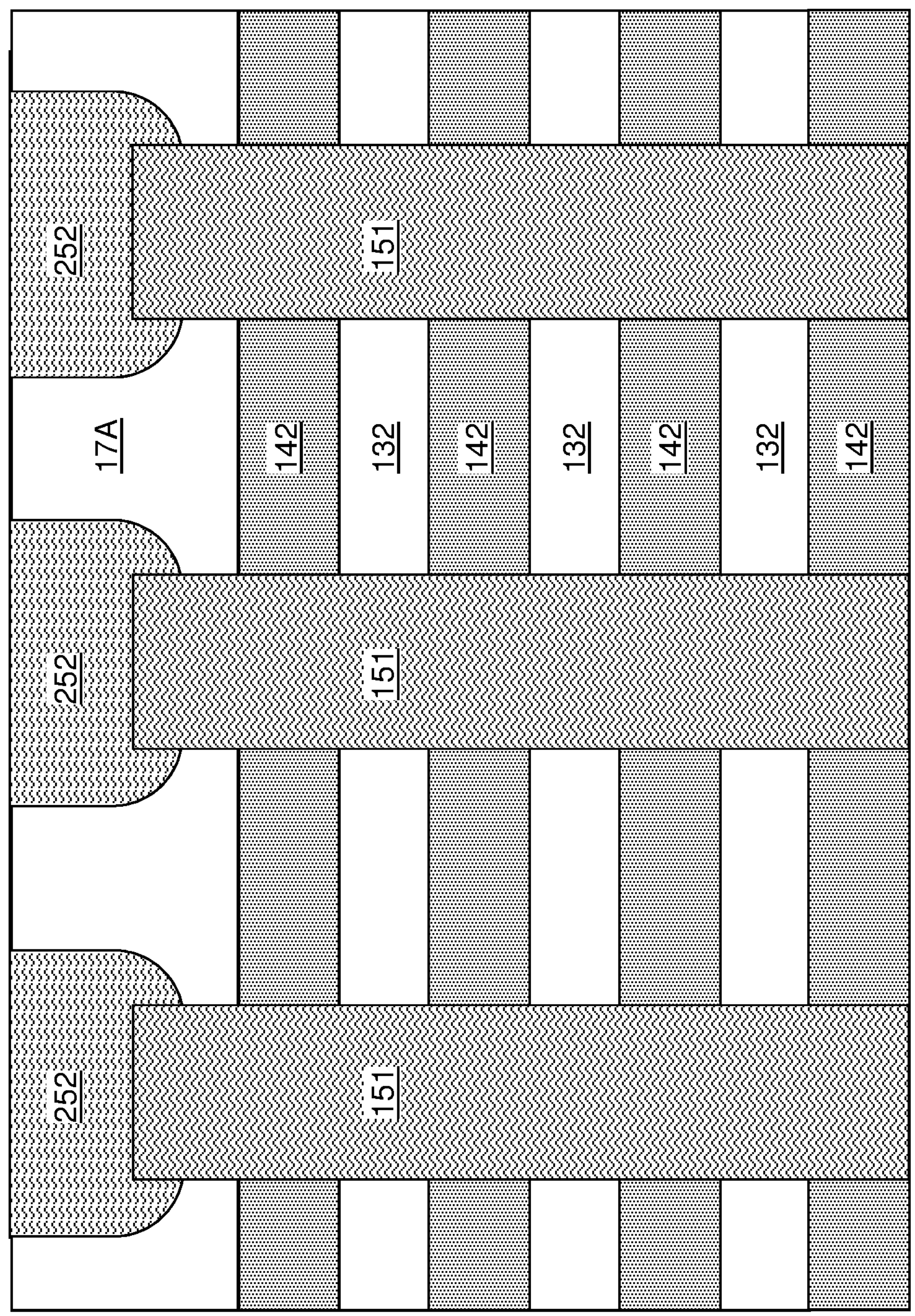

Referring to FIG. 16D, a semiconductor material can be deposited and planarized to form semiconductor material portions 252 that fill the recess regions 147. In one embodiment, the semiconductor material can be a silicon-containing material such as amorphous silicon, polysilicon, or a silicon-germanium alloy. Each combination of a sacrificial memory opening pillar structures 151 and a semiconductor material portion 252 constitutes an in-process sacrificial memory opening fill structure (151, 252). Each combination of a sacrificial support opening pillar structure 111 and a semiconductor material portion 252 constitutes an in-process sacrificial support opening fill structure (111, 252). Each in-process sacrificial memory opening fill structure (151, 252) is formed through the inter-tier dielectric template layer 17A and the first alternating stack (132, 142). An upper portion of each in-process sacrificial memory opening fill structure (151, 252) comprises a semiconductor material portion 252.

Figure 16E:
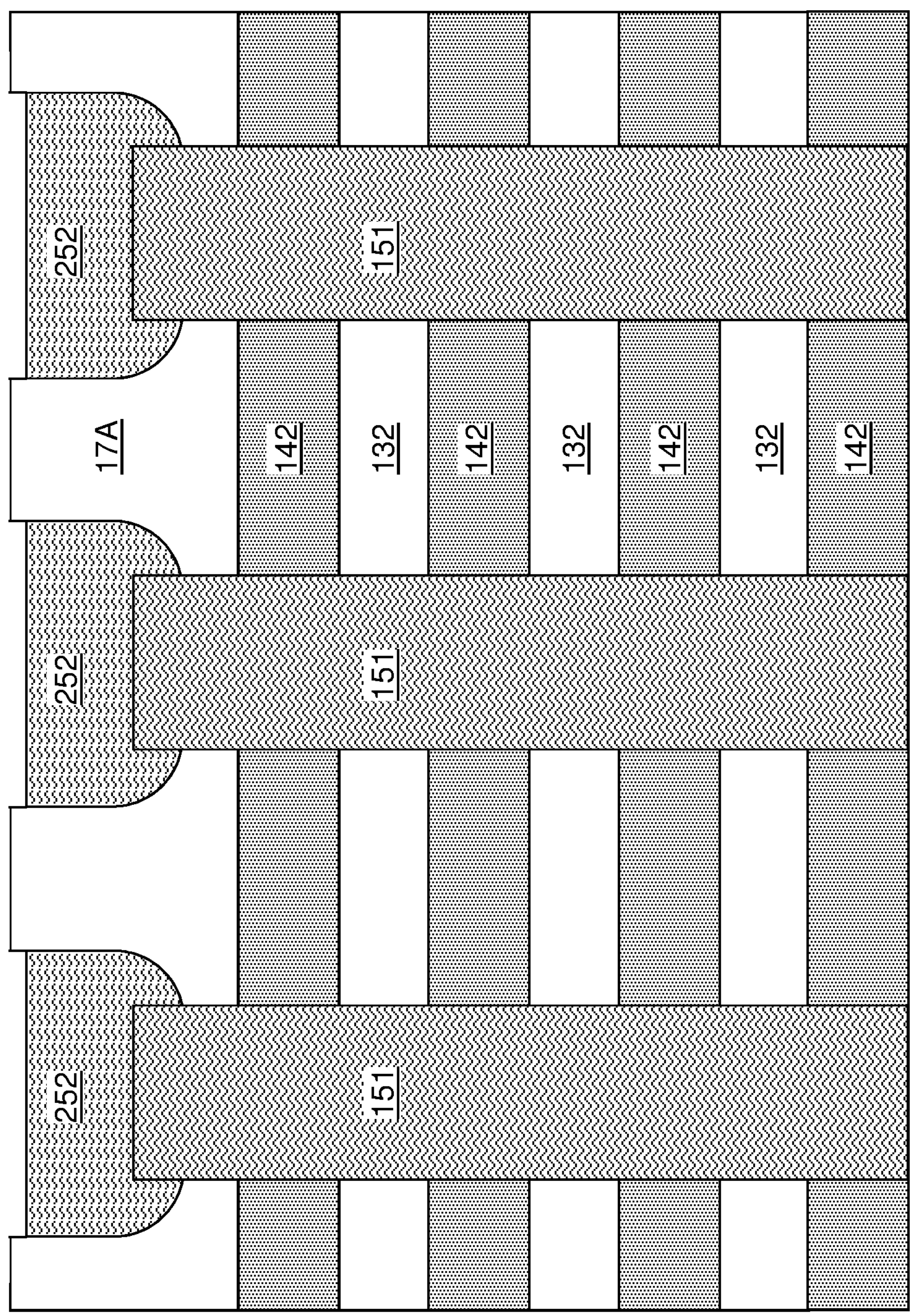

Referring to FIG. 16E, the top surfaces of the semiconductor material portions 252 may be optionally recessed below the horizontal plane including the top surface of the inter-tier dielectric template layer 17A. The recess distance may be in a range from 1 nm to 50 nm, although lesser and greater recess distances may also be employed.

Figure 16F:
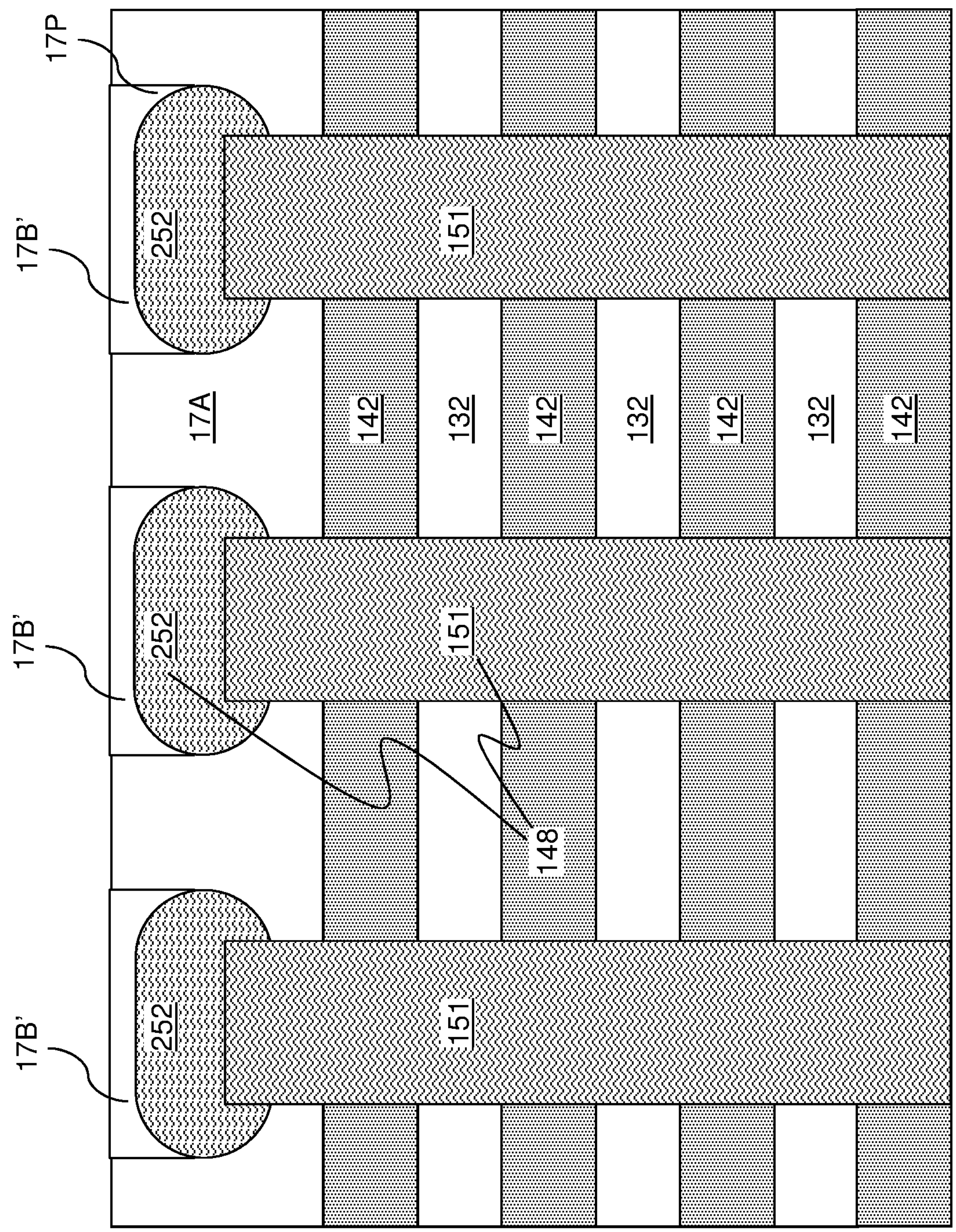

Referring to FIG. 16F, an oxidation process can be performed to oxidize an upper portion of each in-process sacrificial memory opening fill structure (151, 252) and an upper portion of each in-process sacrificial support opening fill structure (111, 252). The oxidation process proceeds with a non-uniform oxidation rate across the top surfaces of the semiconductor material portions 252. Particularly, peripheral regions of the top surfaces of the semiconductor material portions 252 that contact the inter-tier dielectric template layer 17A is supplied with more oxidant molecules (such as $O_2$ or $H_2O$) than non-peripheral regions of the top surfaces of the semiconductor material portions 252 because the oxidant molecules diffuse through the material of the inter-tier dielectric template layer 17A. Further, the vertical interfaces between the sacrificial material portions 252 and the inter-tier dielectric template layer 17A function as diffusion paths for the oxidant molecules. Thus, regions of the semiconductor material portions 252 that are proximal to an interface with the inter-tier dielectric template layer 17A can be oxidized at a greater oxidation rate than regions of the semiconductor material portions 252 that are distal from the interface with the inter-tier dielectric template layer 17A. A thermal oxidation process or a plasma oxidation process may be employed to oxidize surface regions of the semiconductor material portions 252.

In one embodiment, the semiconductor material portions 252 include a silicon-containing semiconductor material, and the oxidation process forms in-process silicon-containing semiconductor oxide portions 17B' by oxidation of surface regions of the sacrificial material portions 252. The in-process silicon-containing semiconductor oxide portions 17B' include an oxidized portion of the semiconductor material portions 252. In one embodiment, the semiconductor material portions 252 can consist essentially of silicon (such as undoped amorphous silicon), and the in-process silicon-containing semiconductor oxide portions 17B' can consist essentially of silicon oxide. In one embodiment, each of the in-process silicon-containing semiconductor oxide portions 17B' can include a tapered annular downward protruding region 17P having a lateral width that decreases with distance from the horizontal plane including the top surface of the inter-tier dielectric template layer 17A.

Figure 16G:
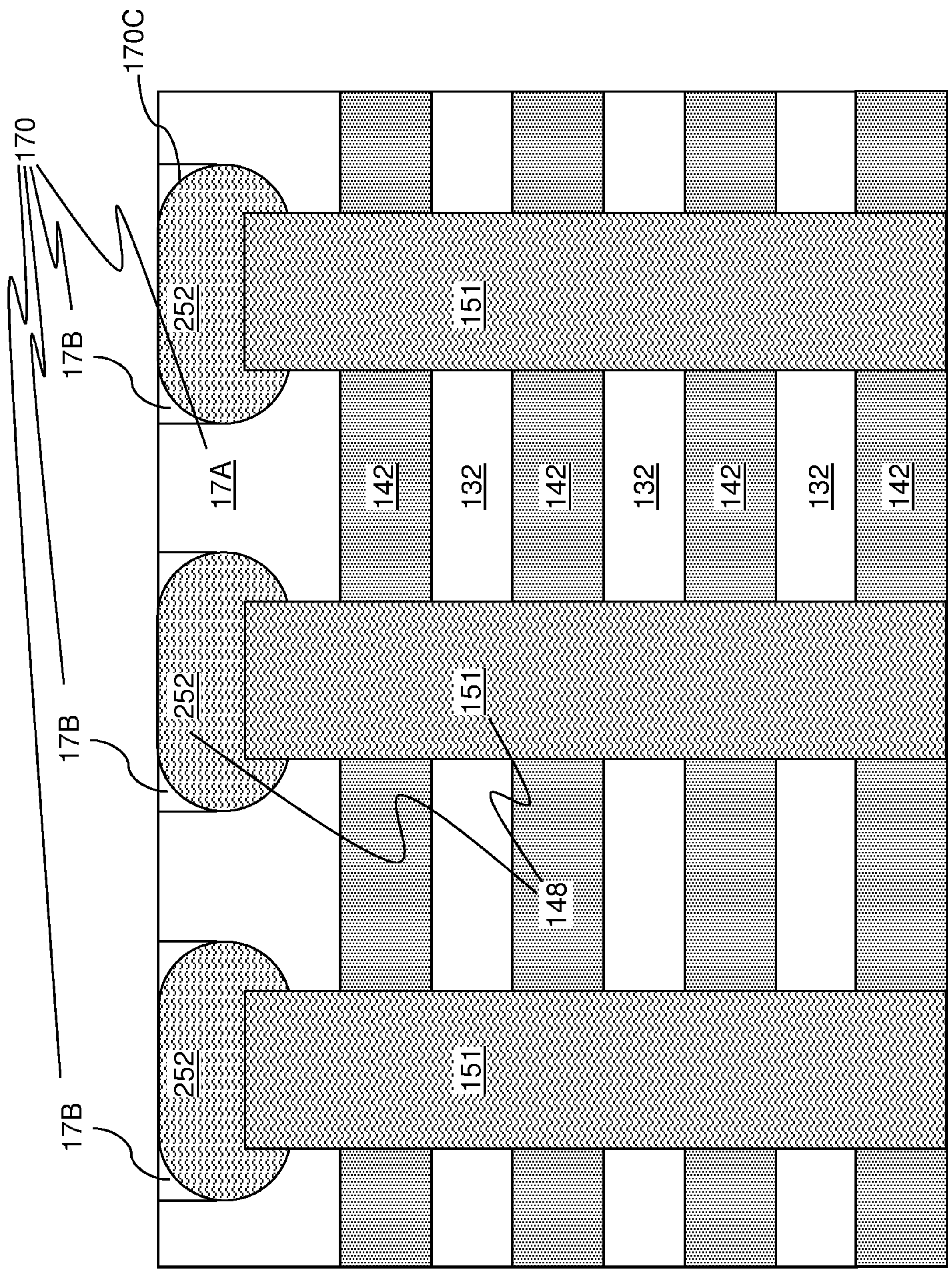

Referring to FIG. 16G, top portions of the in-process silicon-containing semiconductor oxide portions 17B' may be optionally planarized. Top portions of the inter-tier dielectric template layer 17A can be collaterally planarized during planarization of the in-process silicon-containing semiconductor oxide portions 17B'. Remaining portions of the in-process silicon-containing semiconductor oxide portions 17B' constitute silicon-containing semiconductor oxide portions 17B. In one embodiment, the silicon-containing semiconductor oxide portions 17B can consist essentially of thermal silicon oxide that is free or carbon, and has a lower concentration of hydrogen than the inter-tier dielectric template layer 17A.

The unoxidized portion of each in-process sacrificial memory opening fill structure (151, 252) constitutes a sacrificial memory opening fill structure 148. The inter-tier dielectric template layer 17A and the silicon-containing semiconductor oxide portions 17B collectively constitute an inter-tier dielectric layer 170. Convex surfaces 170C of portions of the inter-tier dielectric layer 170 derived from oxidation of the semiconductor material portions 252, i.e., the silicon-containing semiconductor oxide portions 17B, contact convex sidewalls of the remaining portions of the silicon-containing semiconductor oxide portions 17B, which are portions of the sacrificial memory opening fill structures 148. Sacrificial support opening fill structures are simultaneously formed in the first-tier support openings.

Referring to FIG. 17A, the processing steps of FIGS. 7, 8A and 8B can be performed. Subsequently, the sacrificial memory opening fill structures 148 can be removed in the same manner as in the first embodiment, for example, by performing the processing steps of FIG. 10A, to form inter-tier memory openings 49 and inter-tier support openings.

Referring to FIG. 17B, the processing steps of FIGS. 10B-10H can be performed to form memory opening fill structures 58 in the inter-tier memory openings and support pillar structures within each inter-tier support opening. Each memory opening fill structure 58 can include a laterally bulging portion having a rounded top surface and a rounded bottom surface.

Each memory film 50 comprises an upper portion embedded in the second alternating stack (232, 242), a lower portion embedded in the first alternating stack (132, 142), and an inter-tier level portion embedded in the inter-tier dielectric layer 170 and which laterally protrudes outward relative to outer sidewalls of the upper portion and the lower portion. The inter-tier level portion of the memory film 50 has a convex upper surface 50C that contacts a concave downward-facing surface 170C of the inter-tier dielectric layer 170 and a convex lower surface 50D that contact a concave upward-facing surface 170D of the inter-tier dielectric layer 170.

Referring to FIG. 18, the processing steps of FIGS. 11A, 11B, and 12A-12C can be performed to replace the first and second sacrificial material layers (142, 242) with first and second electrically conductive layers (146, 246). Subsequently, the processing steps of FIGS. 13A, 13B, 14A, 14B, and 15 can be performed to provide the additional structures of the first exemplary structure.

Referring to FIG. 19, a region of an alternative embodiment of the second exemplary structure is illustrated after replacement of sacrificial material layers (142, 242) with electrically conductive layers (146, 246). The laterally bulging portion of each memory stack structure 58 may, or may not, include a vertical sidewall 58V that connect a convex upper surface 50C of the memory film 50 that contacts a concave downward-facing surface 170C of the inter-tier dielectric layer 170 and a convex lower surface 50D of the memory film 50 that contact a concave upward-facing surface 170D of the inter-tier dielectric layer 170. In other words, the convex upper surface 50C of the memory film 50 and the convex lower surface 50D of the memory film 50 located in the laterally bulging portion of a memory stack structure 58 may be adjoined to each other directly, as shown in FIG. 18, or they may be adjoined by a vertical sidewall 58V that contacts the inter-tier dielectric layer 170, as shown in FIG. 19.

Referring to all drawings of the present disclosure and according to various embodiments of the present disclosure, a three-dimensional memory device is provided. The three-dimensional memory device comprises: a first alternating stack (132, 146) of first insulating layers 132 and first electrically conductive layers 146 located over a substrate 8; an inter-tier dielectric layer 170 located over the first alternating stack (132, 146); a second alternating stack (232, 246) of second insulating layers 232 and second electrically conductive layers 246 located over the inter-tier dielectric layer 170; a memory stack structure 58 vertically extending through the second alternating stack (232, 246), the inter-tier dielectric layer 170, and the first alternating stack (132, 146). The memory stack structure 58 comprises a semiconductor channel 60 and a memory film 50 laterally surrounding the semiconductor channel 60. The memory film 50 comprises an upper portion embedded in the second alternating stack (232, 246), a lower portion embedded in the first alternating stack (132, 146), and an inter-tier level portion which is embedded in the inter-tier dielectric layer 170 and which laterally protrudes outward relative to outer sidewalls of the upper portion and the lower portion. The inter-tier level portion of the memory film 50 has a convex upper surface 50C that contacts a concave downward-facing surface 170C of the inter-tier dielectric layer 170.

In one embodiment, the memory stack structure 58 is located in a memory opening 49 that extends through the second alternating stack (232, 246), the inter-tier dielectric layer 170, and the first alternating stack (132, 146). The convex upper surface of the memory film 50 azimuthally extends around a vertical axis passing through a geometrical center of the memory opening 49 by 360 degrees. Thus, the convex upper surface can be an annular surface.

In one embodiment, an upper periphery of the convex upper surface adjoins a bottom periphery of a vertical or tapered outer sidewall of the upper portion of the memory film 50. In one embodiment, an upper periphery of the convex upper surface contacts a bottommost insulating layer within the second alternating stack (232, 246). In one embodiment, the inter-tier dielectric layer 170 comprises two different dielectric material compositions, either through the combination of a first inter-tier dielectric component layer 171 and second inter-tier dielectric component layer 172, as illustrated in FIG. 6E, or through the combination of an inter-tier dielectric template layer 17A and silicon-containing semiconductor oxide portions 17B, as illustrated in FIG. 16G, with a horizontal interface or a vertical interface therebetween.

In one embodiment, the memory film 50 comprises, from outside to inside, a blocking dielectric layer 52, a vertical stack of memory elements (as embodied as portions of the charge storage layer 54), and a tunneling dielectric layer 56; and the convex upper surface 50C of the memory films 50 is a convex upper surface of the blocking dielectric layer 52. In one embodiment, the semiconductor channel 60 includes a laterally protruding portion within the inter-tier level portion of the memory film 50, and a convex upper surface of the laterally protruding portion of the semiconductor channel 60 contacts a concave downward-facing surface of the inter-tier level portion of the memory film 50. In one embodiment, the vertical stack of memory elements is embodied as portions of a charge storage layer 54 located at levels of the first and second electrically conductive layers (146, 246), and each of the blocking dielectric layer 52, the charge storage layer 54, and the tunneling dielectric layer 56 has a respective uniform thickness throughout.

In one embodiment, the inter-tier level portion of the memory film 50 has a vertical cylindrical surface 58V that adjoins a bottom periphery of the convex upper surface and contacting a vertical sidewall of the inter-tier dielectric layer 170, as illustrated in FIG. 19.

In one embodiment, the inter-tier level portion of the memory film 50 has a planar annular bottom surface having an inner periphery that adjoins an upper periphery of an outer surface of the lower portion of the memory film 50, as illustrated in FIG. 12C.

In one embodiment, the inter-tier level portion of the memory film 50 has a convex lower surface 50D contacting a concave upward-facing surface 170D of the inter-tier dielectric layer 170, as illustrated in FIGS. 18 and 19.

In one embodiment, each vertically neighboring pair of a first insulating layer 132 and a first electrically conductive layer 146 and each vertically neighboring pair of a second insulating layer 232 and a second electrically conductive layer 246 is spaced by a horizontal portion of a respective backside blocking dielectric layer 44 that is adjoined to a cylindrical portion that laterally surrounds, and contacts an outer sidewall of, the memory film 50.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device, bottom ends of the memory stack structures 58 contact a planar semiconductor material layer 10, and the monolithic three-dimensional NAND memory device comprises an array of monolithic three-dimensional NAND strings over the planar semiconductor material layer 10.

At least one memory cell in a first device level of the array of monolithic three-dimensional NAND strings is located over another memory cell in a second device level of the array of monolithic three-dimensional NAND strings. The at least one semiconductor device 710 comprises an integrated circuit comprising a driver circuit for monolithic three-dimensional NAND memory device located thereon. The electrically conductive layers (146, 246) comprise a plurality of control gate electrodes having a strip shape extending substantially parallel to the top surface of the substrate 9.

The plurality of control gate electrodes comprises at least a first control gate electrode located in the first device level and a second control gate electrode located in the second device level. The array of monolithic three-dimensional NAND strings comprises a plurality of semiconductor channels (59, 11, 60), wherein at least one end portion 60 of each of the plurality of semiconductor channels (59, 11, 60) extends substantially perpendicular to a top surface of the semiconductor substrate, and a plurality of charge storage elements (as embodied as portions of the charge storage layers 54 located at levels of the electrically conductive layers (146, 246)), each charge storage element located adjacent to a respective one of the plurality of semiconductor channels (59, 11, 60).

The laterally bulging portion of the memory film 50 has an upper convex surface 50C that reduces or prevents concentration of electrical fields during a high voltage operation, such as an erase operation. By avoiding formation of sharp corners in the upper region of the laterally bulging portion and optionally in the lower region of the laterally bulging portion of the memory film 50 at the joint between memory tiers, the joint level structure of the present disclosure can enhance reliability of a three-dimensional memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

a first alternating stack of first insulating layers and first electrically conductive layers located over a substrate;

an inter-tier dielectric layer located over the first alternating stack;

a second alternating stack of second insulating layers and second electrically conductive layers located over the inter-tier dielectric layer;

a memory stack structure vertically extending through the second alternating stack, the inter-tier dielectric layer, and the first alternating stack, wherein the memory stack structure is located in a memory opening that extends through the second alternating stack, the inter-tier dielectric layer, and the first alternating stack, wherein:

the memory stack structure comprises a semiconductor channel and a memory film laterally surrounding the semiconductor channel;

the memory film comprises an upper portion embedded in the second alternating stack, a lower portion embedded in the first alternating stack, and an inter-tier level portion embedded in the inter-tier dielectric layer and laterally protrudes outward relative to outer sidewalls of the upper portion and the lower portion; and the inter-tier level portion of the memory film has a convex upper surface that contacts a concave downward-facing surface of the inter-tier dielectric layer and the inter-tier level portion of the memory film that has the convex upper surface has a lateral extent in a range from 10 nm to 200 nm in a vertical cross-sectional view within a vertical plane that includes a vertical axis passing through a geometrical center of the memory opening.

2. The three-dimensional memory device of claim 1, wherein:

the convex upper surface of the memory film azimuthally extends around the vertical axis passing through the geometrical center of the memory opening by 360 degrees.

3. The three-dimensional memory device of claim 1, wherein an upper periphery of the convex upper surface adjoins a bottom periphery of a vertical or tapered outer sidewall of the upper portion of the memory film.

4. The three-dimensional memory device of claim 1, wherein an upper periphery of the convex upper surface contacts a bottommost insulating layer within the second alternating stack.

5. The three-dimensional memory device of claim 1, wherein the inter-tier dielectric layer comprises two different dielectric material compositions with a horizontal interface or a vertical interface therebetween.

6. The three-dimensional memory device of claim 1, wherein:

the memory film comprises, from outside to inside, a blocking dielectric layer, a vertical stack of memory elements, and a tunneling dielectric layer; and the convex upper surface of the memory films is a convex upper surface of the blocking dielectric layer.

7. The three-dimensional memory device of claim 6, wherein:

the semiconductor channel includes a laterally protruding portion within the inter-tier level portion of the memory film;

a convex upper surface of the laterally protruding portion of the semiconductor channel contacts a concave downward-facing surface of the inter-tier level portion of the memory film; and the vertical stack of memory elements is embodied as portions of a charge storage layer located at levels of the first and second electrically conductive layers; and each of the blocking dielectric layer, the charge storage layer, and the tunneling dielectric layer has a respective uniform thickness throughout.

8. The three-dimensional memory device of claim 1, wherein the inter-tier level portion of the memory film has a vertical cylindrical surface that adjoins a bottom periphery of the convex upper surface and contacting a vertical sidewall of the inter-tier dielectric layer.

9. The three-dimensional memory device of claim 1, wherein the inter-tier level portion of the memory film has a planar annular bottom surface having an inner periphery that adjoins an upper periphery of an outer surface of the lower portion of the memory film.

10. The three-dimensional memory device of claim 1, wherein the inter-tier level portion of the memory film has a convex lower surface contacting a concave upward-facing surface of the inter-tier dielectric layer.

11. The three-dimensional memory device of claim 1, wherein each vertically neighboring pair of a first insulating layer and a first electrically conductive layer and each vertically neighboring pair of a second insulating layer and a second electrically conductive layer is spaced by a horizontal portion of a respective backside blocking dielectric layer that is adjoined to a cylindrical portion that laterally surrounds, and contacts an outer sidewall of, the memory film.

12. The three-dimensional memory device of claim 1, wherein:

the three-dimensional memory device comprises a monolithic three-dimensional NAND memory device;

the first and second electrically conductive layers comprise, or are electrically connected to, a respective word line of the monolithic three-dimensional NAND memory device;

an integrated circuit comprising a driver circuit for monolithic three-dimensional NAND memory device is located on the substrate;

the monolithic three-dimensional NAND memory device comprises an array of monolithic three-dimensional NAND strings; and the array of monolithic three-dimensional NAND strings comprises:

a plurality of semiconductor channels, wherein at least one end portion of each of the plurality of semiconductor channels extends substantially perpendicular to a top surface of the semiconductor substrate, and a plurality of charge storage elements, each charge storage element located adjacent to a respective one of the plurality of semiconductor channels.

13. The three-dimensional memory device of claim 1, wherein the inter-tier level portion of the memory film that has the convex upper surface has the lateral extent in the range from 20 nm to 100 nm in a vertical cross-sectional view within the vertical plane that includes the vertical axis passing through the geometrical center of the memory opening.

14. The three-dimensional memory device of claim 1, wherein the concave downward-facing surface of the inter-tier dielectric layer has a lateral extent in the range from 10 nm to 200 nm in a vertical cross-sectional view within the vertical plane that includes the vertical axis passing through the geometrical center of the memory opening.

15. The three-dimensional memory device of claim 14, wherein the concave downward-facing surface of the inter-tier dielectric layer has a lateral extent in the range from 20 nm to 100 nm in a vertical cross-sectional view within the vertical plane that includes the vertical axis passing through the geometrical center of the memory opening.

* * * * *